US011621678B2

(12) United States Patent
Obu et al.

(10) Patent No.: US 11,621,678 B2
(45) Date of Patent: Apr. 4, 2023

(54) SEMICONDUCTOR DEVICE AND POWER AMPLIFIER MODULE

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Masahiro Shibata, Nagaokakyo (JP); Kenichi Nagura, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 121 days.

(21) Appl. No.: 17/143,940

(22) Filed: Jan. 7, 2021

(65) Prior Publication Data

US 2021/0126591 A1  Apr. 29, 2021

Related U.S. Application Data

(63) Continuation of application No. 16/785,482, filed on Feb. 7, 2020, now Pat. No. 10,903,803, which is a
(Continued)

(30) Foreign Application Priority Data

Apr. 25, 2017 (JP) .............................. JP2017-085831

(51) Int. Cl.
*H03F 1/52* (2006.01)
*H01L 23/00* (2006.01)
(Continued)

(52) U.S. Cl.
CPC ........... *H03F 1/52* (2013.01); *H01L 21/0217* (2013.01); *H01L 21/0262* (2013.01);
(Continued)

(58) Field of Classification Search
CPC . H03F 1/52; H03F 1/565; H03F 3/195; H03F 3/213; H03F 2200/222;
(Continued)

(56) References Cited

U.S. PATENT DOCUMENTS 7,741,714 B2  6/2010  Huang et al.
9,356,127 B2  5/2016  Tsai et al.
(Continued)

FOREIGN PATENT DOCUMENTS

CN  1770437 A  5/2006
CN  102629568 A  8/2012
(Continued)

OTHER PUBLICATIONS

An Office Action mailed by China National Intellectual Property Administration dated May 31, 2021 which corresponds to Chinese Patent Application No. 201810261605.4 and is related to U.S. Appl. No. 17/143,940 with English language translation.

*Primary Examiner* — Matthew L Reames
(74) *Attorney, Agent, or Firm* — Studebaker & Brackett PC

(57) ABSTRACT

A circuit element is formed on a substrate made of a compound semiconductor. A bonding pad is disposed on the circuit element so as to at least partially overlap the circuit element. The bonding pad includes a first metal film and a second metal film formed on the first metal film. A metal material of the second metal film has a higher Young's modulus than a metal material of the first metal film.

19 Claims, 37 Drawing Sheets

Related U.S. Application Data continuation of application No. 16/435,321, filed on Jun. 7, 2019, now Pat. No. 10,594,271, which is a continuation of application No. 15/946,552, filed on Apr. 5, 2018, now Pat. No. 10,361,666.

(51) Int. Cl.

| | | |
|---|---|---|
| *H01L 29/04* | (2006.01) | |
| *H03F 3/213* | (2006.01) | |
| *H01L 29/737* | (2006.01) | |
| *H01L 27/02* | (2006.01) | |
| *H01L 27/06* | (2006.01) | |
| *H01L 29/08* | (2006.01) | |
| *H01L 29/10* | (2006.01) | |
| *H01L 29/205* | (2006.01) | |
| *H01L 29/06* | (2006.01) | |
| *H01L 21/265* | (2006.01) | |
| *H01L 29/417* | (2006.01) | |
| *H01L 29/423* | (2006.01) | |
| *H01L 23/48* | (2006.01) | |
| *H01L 29/861* | (2006.01) | |
| *H01L 21/768* | (2006.01) | |
| *H03F 3/195* | (2006.01) | |
| *H01L 21/02* | (2006.01) | |
| *H01L 29/36* | (2006.01) | |
| *H01L 29/207* | (2006.01) | |
| *H01L 29/45* | (2006.01) | |
| *H01L 21/285* | (2006.01) | |
| *H01L 21/3213* | (2006.01) | |
| *H01L 21/027* | (2006.01) | |
| *H01L 29/66* | (2006.01) | |
| *H01L 21/306* | (2006.01) | |
| *H01L 21/311* | (2006.01) | |
| *H03F 1/56* | (2006.01) | |
| *H01L 23/31* | (2006.01) | |
| *H01L 23/29* | (2006.01) | |
| *H01L 23/538* | (2006.01) | |
| *H01L 25/16* | (2023.01) | |
| *H01L 21/8252* | (2006.01) | |

(52) U.S. Cl.
CPC .... *H01L 21/0274* (2013.01); *H01L 21/02271* (2013.01); *H01L 21/02546* (2013.01); *H01L 21/2654* (2013.01); *H01L 21/28575* (2013.01); *H01L 21/30612* (2013.01); *H01L 21/31116* (2013.01); *H01L 21/31144* (2013.01); *H01L 21/32134* (2013.01); *H01L 21/76895* (2013.01); *H01L 21/76897* (2013.01); *H01L 21/76898* (2013.01); *H01L 23/481* (2013.01); *H01L 24/03* (2013.01); *H01L 24/05* (2013.01); *H01L 24/48* (2013.01); *H01L 24/85* (2013.01); *H01L 27/0248* (2013.01); *H01L 27/0605* (2013.01); *H01L 27/0652* (2013.01); *H01L 29/045* (2013.01); *H01L 29/0642* (2013.01); *H01L 29/0692* (2013.01); *H01L 29/0804* (2013.01); *H01L 29/0817* (2013.01); *H01L 29/0821* (2013.01); *H01L 29/1004* (2013.01); *H01L 29/205* (2013.01); *H01L 29/207* (2013.01); *H01L 29/36* (2013.01); *H01L 29/41708* (2013.01); *H01L 29/42304* (2013.01); *H01L 29/452* (2013.01); *H01L 29/66204* (2013.01); *H01L 29/66242* (2013.01); *H01L 29/66318* (2013.01); *H01L 29/7371* (2013.01); *H01L 29/861* (2013.01); *H01L 29/8613* (2013.01); *H03F 1/565* (2013.01); *H03F 3/195* (2013.01); *H03F 3/213* (2013.01); *H01L 21/8252* (2013.01); *H01L 23/291* (2013.01); *H01L 23/3121* (2013.01); *H01L 23/3171* (2013.01); *H01L 23/5383* (2013.01); *H01L 23/5384* (2013.01); *H01L 23/5386* (2013.01); *H01L 25/16* (2013.01); *H01L 27/0635* (2013.01); *H01L 27/0664* (2013.01); *H01L 29/0657* (2013.01); *H01L 2224/0221* (2013.01); *H01L 2224/0345* (2013.01); *H01L 2224/0362* (2013.01); *H01L 2224/03462* (2013.01); *H01L 2224/03464* (2013.01); *H01L 2224/04042* (2013.01); *H01L 2224/0518* (2013.01); *H01L 2224/05025* (2013.01); *H01L 2224/05084* (2013.01); *H01L 2224/05144* (2013.01); *H01L 2224/05147* (2013.01); *H01L 2224/05155* (2013.01); *H01L 2224/05573* (2013.01); *H01L 2224/05644* (2013.01); *H01L 2224/32225* (2013.01); *H01L 2224/45144* (2013.01); *H01L 2224/48106* (2013.01); *H01L 2224/48227* (2013.01); *H01L 2224/48463* (2013.01); *H01L 2224/73265* (2013.01); *H01L 2224/85203* (2013.01); *H01L 2224/85205* (2013.01); *H01L 2924/10329* (2013.01); *H01L 2924/10337* (2013.01); *H01L 2924/13051* (2013.01); *H01L 2924/13063* (2013.01); *H01L 2924/13064* (2013.01); *H01L 2924/19041* (2013.01); *H01L 2924/19043* (2013.01); *H03F 2200/222* (2013.01); *H03F 2200/387* (2013.01); *H03F 2200/411* (2013.01); *H03F 2200/426* (2013.01); *H03F 2200/444* (2013.01); *H03F 2200/451* (2013.01)

(58) Field of Classification Search
CPC ......... H03F 2200/387; H03F 2200/411; H03F 2200/444; H03F 2200/451
See application file for complete search history.

(56) References Cited

U.S. PATENT DOCUMENTS

| | | |
|---|---|---|
| 2005/0156194 A1 | 7/2005 | Ohbu et al. |
| 2006/0091536 A1 | 5/2006 | Huang et al. |
| 2006/0099767 A1 | 5/2006 | Min et al. |
| 2013/0241058 A1 | 9/2013 | Yu et al. |
| 2014/0312390 A1 | 10/2014 | Tsai et al. |
| 2015/0255585 A1 | 9/2015 | Chin et al. |

FOREIGN PATENT DOCUMENTS

| | | |
|---|---|---|
| CN | 103915399 A | 7/2014 |
| JP | S62-004365 A | 1/1987 |
| JP | S64-072558 A | 3/1989 |
| JP | H02-025045 A | 1/1990 |
| JP | H05-048078 A | 2/1993 |
| JP | 2000-164623 A | 6/2000 |
| JP | 2005-236259 A | 9/2005 |
| JP | 2012-164825 A | 8/2012 |
| TW | 201340223 A | 10/2013 |
| WO | 2001/018865 A1 | 3/2001 |

FIG. 4

| METAL | VICKERS HARDNESS (HV) | YOUNG'S MODULUS (GPa) | ELECTRICAL RESISTIVITY ($\times 10^{-8} \Omega m$) |
|---|---|---|---|
| Al | 25 | 70 | 2.69 |
| Au | 26 | 79 | 2.30 |
| Ag | 26 | 83 | 1.60 |
| Cu | 46 | 128 | 1.67 |
| Pt | 56 | 168 | 10.60 |
| Ni | 96 | 200 | 6.84 |
| Ti | 120 | 116 | 55.00 |
| Mo | 147 | 324 | 5.70 |

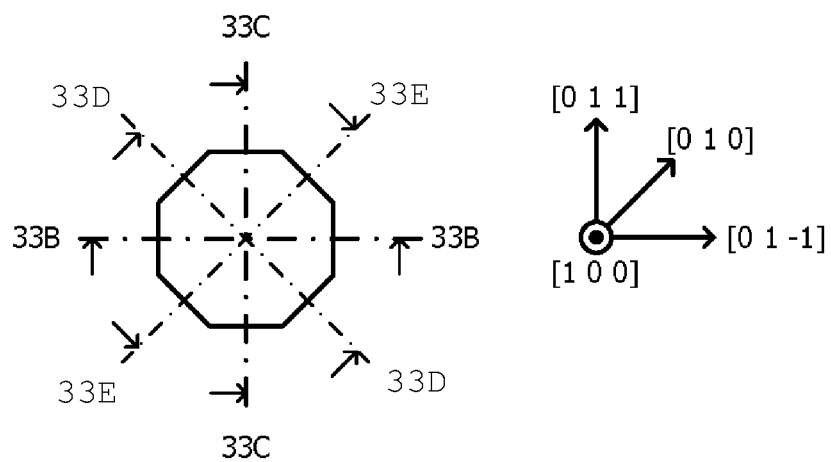
FIG. 33A
FIG. 33B
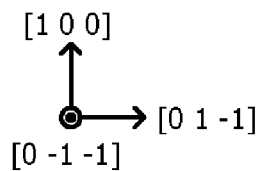
FIG. 33C
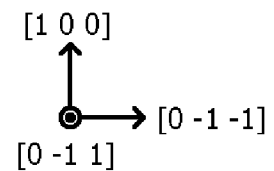
FIG. 33D
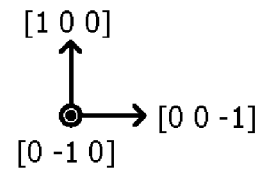
FIG. 33E
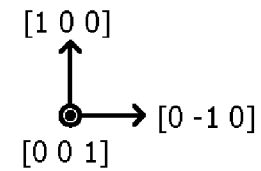

SEMICONDUCTOR DEVICE AND POWER AMPLIFIER MODULE

CROSS-REFERENCE TO RELATED APPLICATION

This application is a Continuation of U.S. application Ser. No. 16/785,482, filed Feb. 7, 2020, which is a Continuation of U.S. patent application Ser. No. 16/435,321, filed Jun. 7, 2019, which is a Continuation of U.S. patent application Ser. No. 15/946,552 filed Apr. 5, 2018, which claims benefit of priority to Japanese Patent Application No. 2017-085831 filed Apr. 25, 2017, the entire content of which is incorporated herein by reference.

BACKGROUND

Technical Field

The present disclosure relates to a semiconductor device and a power amplifier module.

Background Art

Japanese Unexamined Patent Application Publication No. 2005-236259 and International Publication No. 2001/018865 each disclose a semiconductor device for a high-frequency amplifier module using a heterojunction bipolar transistor (HBT). The semiconductor device includes a protection circuit for protecting the HBT. The protection circuit prevents breakdown of the HBT when an excessive voltage such as static electricity is applied to the HBT. The protection circuit has a circuit configuration in which a plurality of diodes are connected in series, and is connected between a collector and an emitter of the HBT.

Japanese Unexamined Patent Application Publication No. 2000-164623 discloses a semiconductor device in which an electrode pad is formed on a wiring line or an active element. A projection electrode for protecting the wiring line or the active element during bonding is formed on a surface of the electrode pad (bonding pad). The projection electrode is formed by substituting Al on the surface of the electrode pad with Zn, which is capable of being subjected to substitution reaction with Ni, and then coating the surface of the electrode pad with NiP by electroless plating. It is also disclosed that, besides NiP, a Cu-based metal which can be deposited by electroless plating may be used.

SUMMARY

In the semiconductor devices disclosed in Japanese Unexamined Patent Application Publication No. 2005-236259 and International Publication No. 2001/018865, it is necessary to secure, on a semiconductor substrate, a region for arranging the plurality of diodes that constitute the protective circuit. As a result, the chip area becomes larger. An increase in the chip area makes it difficult to realize a reduction in the cost of compound semiconductor devices.

As in the semiconductor device disclosed in Japanese Unexamined Patent Application Publication No. 2000-164623, the arrangement of the bonding pad on a wiring line or an active element enables an increase in the chip area to be suppressed. In silicon-based semiconductor processes, Al is used in wiring lines and bonding pads. However, in compound semiconductor processes, Al is not usually used in wiring lines or bonding pads. Therefore, it is difficult to apply the technique disclosed in Japanese Unexamined Patent Application Publication No. 2000-164623 to compound semiconductor processes without modifications.

Accordingly, the present disclosure provides a semiconductor device that includes a substrate made of a compound semiconductor, in which an increase in the chip area can be suppressed. The present disclosure also provides a power amplifier module that includes the semiconductor device.

According to a preferred embodiment of the present disclosure, a semiconductor device includes a circuit element formed on a substrate made of a compound semiconductor, and a bonding pad disposed on the circuit element so as to at least partially overlap the circuit element. In the semiconductor device, the bonding pad includes a first metal film and a second metal film formed on the first metal film, and a metal material of the second metal film has a higher Young's modulus than a metal material of the first metal film.

Since the circuit element and the bonding pad are disposed so as to partially overlap, it is not necessary to secure a dedicated region for arranging the bonding pad. With this structure, an increase in the chip area can be suppressed. The second metal film functions as a stress dispersion sheet to thereby disperse a stress generated in the circuit element during bonding, and thus breakdown of the circuit element can be suppressed.

The bonding pad may further include a third metal film formed on the second metal film, and the third metal film may be formed of the same metal material as the first metal film. As the third metal film, a metal material having a low contact resistance with a bonding wire can be used. The contact resistance between the bonding pad and the bonding wire can be reduced compared with the case where the bonding wire is directly bonded to the second metal film.

The first metal film and the third metal film may be formed of Au, and the second metal film may include a layer made of at least one metal material selected from the group consisting of Cu, Ni, and Mo. It is possible to use Au, which is typically used for wiring lines for connecting a plurality of circuit elements formed on a compound semiconductor substrate. Since Cu, Ni, and Mo are harder than Au, the second metal film functions as a stress dispersion sheet. The second metal film may include two layers made of at least two metal materials selected from the group consisting of Cu, Ni, and Mo. By combining a plurality of metal materials, it is also possible to enhance the degree of freedom of selection of hardness, electrical resistivity, and the like as a whole of the second metal film.

The semiconductor device may further include a protective film on the first metal film, in which the protective film has an opening disposed inside the first metal film in plan view, and the second metal film and the third metal film are disposed inside the opening in plan view. A load applied to the second metal film and the third metal film during bonding is not transferred to the protective film. Accordingly, the protective film is unlikely to be damaged during bonding.

The semiconductor device may further include a fourth metal film that is formed of the same metal material as the first metal film and that covers a region of an upper surface of the first metal film inside the opening, the region not being covered with the second metal film, a side surface of the second metal film, and a side surface and an upper surface of the third metal film. Since a bonding interface between the second metal film and the third metal film, which are made of dissimilar metals, is covered with the fourth metal film, occurrence of galvanic corrosion can be suppressed.

The compound semiconductor of the substrate may have a zincblend crystal structure, the substrate may have an upper surface having an off-angle of 4° or less from a (100) plane, and the circuit element may be one element selected from the group consisting of a heterojunction bipolar transistor, a field-effect transistor, a diode, a capacitor, and a resistive element. It is possible to suppress damage of circuit elements, such as a heterojunction bipolar transistor, a field-effect transistor, a diode, a capacitor, and a resistive element, which are formed on a compound semiconductor substrate having a zincblend crystal structure in configurations in which these circuit elements are disposed so as to overlap bonding pads.

The circuit element may include a mesa structure including a semiconductor layer that is epitaxially grown from the substrate, an upper surface of the mesa structure may have a rectangular or square planar shape including a side parallel to a [01-1] direction and a side parallel to a [011] direction, and the side parallel to the [011] direction may be shorter than the side parallel to the [01-1] direction.

When a semiconductor layer is anisotropically etched by wet etching using a rectangular or square etching mask including a side parallel to the [01-1] direction and a side parallel to the [011] direction, side etching proceeds from the side parallel to the [011] direction, resulting in the formation of an eave-shaped portion. Herein, the term "anisotropic etching" refers to etching performed by using the difference in the etching rate due to crystal planes. The eave-shaped portion is easily broken by a stress generated during bonding. Since the side parallel to the [011] direction is shorter than the side parallel to the [01-1] direction, a region where such an eave-shaped portion is formed is narrow. Accordingly, the breakage during bonding can be suppressed.

The circuit element may include a mesa structure including a semiconductor layer that is epitaxially grown from the substrate, and an upper surface of the mesa structure may have a polygonal planar shape including a side parallel to a [001] direction and a side parallel to a [010] direction.

When a semiconductor layer is anisotropically etched by wet etching using a polygonal etching mask including a side parallel to the [001] direction and a side parallel to the [010] direction, side surfaces that rise substantially perpendicularly are formed so as to correspond to these sides. Since no eave-shaped portions are formed, the breakage during bonding can be suppressed.

The upper surface of the mesa structure may have a parallel hexagonal planar shape further including a side parallel to a [01-1] direction. A side surface corresponding to the side parallel to the [01-1] direction is gently inclined. Since no eave-shaped portions are formed, the breakage during bonding can be suppressed.

According to another preferred embodiment of the present disclosure, a power amplifier module includes a semiconductor device including a power amplifier circuit that includes a heterojunction bipolar transistor formed on a substrate made of a compound semiconductor, a protection circuit connected between an emitter and a collector of the heterojunction bipolar transistor, and a bonding pad functioning as an output terminal of the power amplifier circuit, in which at least one circuit element that forms the power amplifier circuit and the protection circuit and the bonding pad are disposed so as to partially overlap, the bonding pad includes at least two layers of a first metal film and a second metal film, and a metal material of the second metal film has a higher Young's modulus than a metal material of the first metal film; a printed circuit board on which the semiconductor device is mounted; and a bonding wire that is bonded to the bonding pad to connect the bonding pad to a wiring line of the printed circuit board.

Since at least one circuit element and the bonding pad are disposed so as to partially overlap, it is not necessary to secure a dedicated region for arranging the bonding pad. With this structure, an increase in the chip area of the semiconductor device can be suppressed. The second metal film functions as a stress dispersion sheet to thereby disperse a stress generated in the circuit element during bonding, and thus breakdown of the circuit element can be suppressed.

Since the circuit element and the bonding pad are disposed so as to partially overlap, it is not necessary to secure a dedicated region for arranging the bonding pad. With this structure, an increase in the chip area can be suppressed. The second metal film functions as a stress dispersion sheet to thereby disperse a stress generated in the circuit element during bonding, and thus breakdown of the circuit element can be suppressed.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 4 is a table listing Vickers hardness, Young's modulus, and electrical resistivity of various metals;

FIG. 33A is a plan view of a regular octagonal mesa formed, by anisotropic etching, on a GaAs substrate having a (100) plane as an upper surface, and FIGS. 33B, 33C, 33D, and 33E are sectional views taken along dash-dotted lines 33B-33B, 33C-33C, 33D-33D, and 33E-33E of FIG. 33A, respectively;

DETAILED DESCRIPTION

First Embodiment

A semiconductor device according to a first embodiment will be described with reference to FIGS. 1A to 4.

Figure 1A:
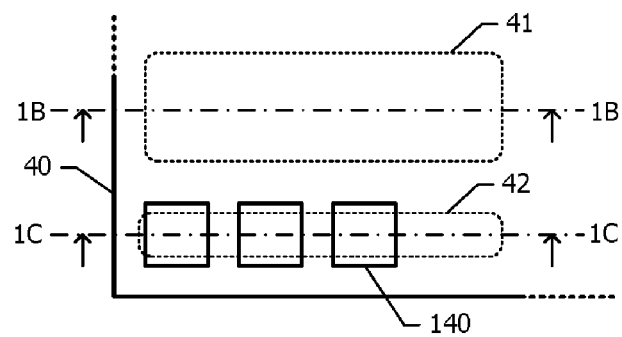
FIG. 1A is a plan view of a part of a semiconductor device according to a first embodiment.

FIG. 1A is a plan view of a part of a semiconductor device according to the first embodiment. Circuit elements such as a heterojunction bipolar transistor (HBT) 41 and a protection circuit 42 are formed on a substrate 40 made of semi-insulating GaAs. A plurality of bonding pads 140 are disposed so as to partially overlap the circuit element constituting the protection circuit 42.

Figure 1B:
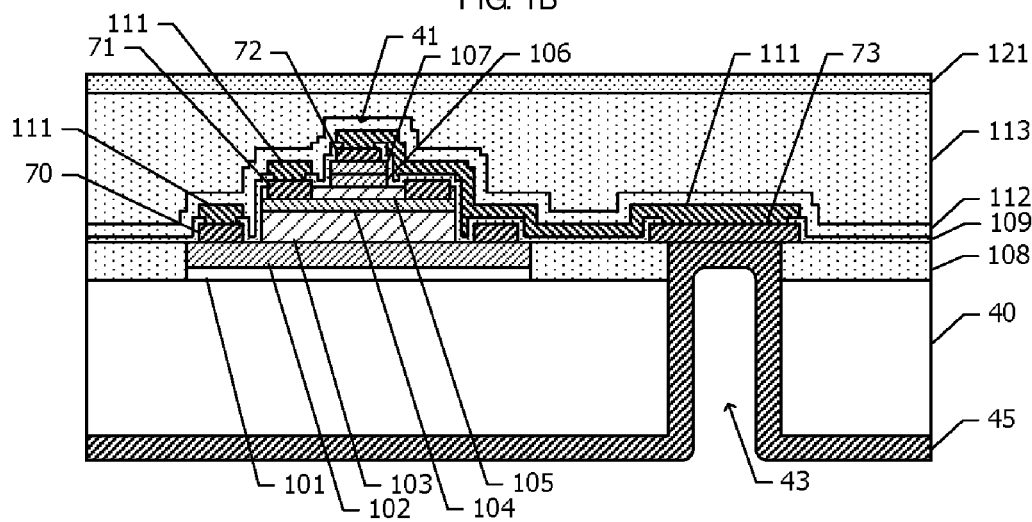
FIGS. 1B and 1C are sectional views taken along dash-dotted lines 1B-1B and 1C-1C of FIG. 1A, respectively.

FIG. 1B is a sectional view taken along dash-dotted line 1B-1B of FIG. 1A. On the substrate 40, a buffer layer 101, a sub-collector layer 102, a collector layer 103, a base layer 104, an emitter layer 105, and contact layers 106 and 107 are stacked in this order. The buffer layer 101 is formed of undoped GaAs, and the sub-collector layer 102 and the collector layer 103 are formed of n-type GaAs. The base layer 104 is formed of p-type GaAs. The emitter layer 105 is formed of n-type InGaP. The contact layers 106 and 107 are formed of n-type GaAs and n-type InGaAs, respectively.

An element isolation region 108 is formed by implanting boron (B) into partial regions of the buffer layer 101 and the sub-collector layer 102. The HBT 41 including the sub-collector layer 102, the collector layer 103, the base layer 104, and the emitter layer 105 is formed on the substrate 40. A collector electrode 70 is formed on the sub-collector layer 102, and the collector electrode 70 is ohmically connected to the sub-collector layer 102. A base electrode 71 formed on the emitter layer 105 penetrates through the emitter layer 105 and is ohmically connected to the base layer 104. An emitter electrode 72 formed on the contact layer 107 is ohmically connected to the contact layer 107.

A via-hole connecting pad 73 is formed on the element isolation region 108 on the lateral side of the HBT 41. An interlayer insulating film 109 is formed over the entire region of the substrate 40 so as to cover the HBT 41 and the via-hole connecting pad 73. For example, silicon nitride (SiN) is used for the interlayer insulating film 109. A plurality of contact holes are formed at predetermined positions of the interlayer insulating film 109, for example, at positions where the collector electrode 70, the base electrode 71, the emitter electrode 72, and the via-hole connecting pad 73 are disposed.

A wiring line 111 formed on the interlayer insulating film 109 connects the emitter electrode 72 and the via-hole connecting pad 73. Furthermore, a plurality of other wiring lines 111 are connected to the collector electrode 70 and the base electrode 71.

An interlayer insulating film 112 is formed over the entire region of the substrate 40 so as to cover the wiring lines 111. An upper interlayer insulating film 113 is further formed on the interlayer insulating film 112. For example, SiN is used for the interlayer insulating film 112, and a polyimide is used for the upper interlayer insulating film 113. A protective film 121 is formed on the interlayer insulating film 113. For example, SiN is used for the protective film 121.

A via-hole 43 is formed from a back surface of the substrate 40 toward the via-hole connecting pad 73. A back-surface electrode 45 formed on the back surface of the substrate 40 is connected to the via-hole connecting pad 73 through the via-hole 43.

Figure 1C:
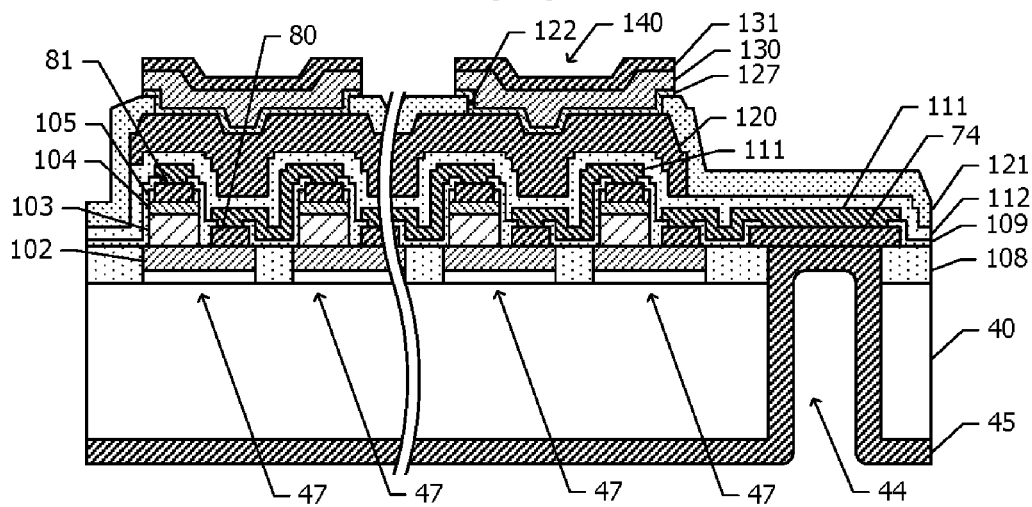

FIG. 1C is a sectional view taken along dash-dotted lines 1C-1C of FIG. 1A. A plurality of diodes 47 using the p-n junction of the collector layer 103 and the base layer 104 are formed on the substrate 40. The diodes 47 are connected in series to thereby form the protection circuit 42 (FIG. 1A).

A cathode electrode 80 formed on the sub-collector layer 102 of each of the diodes 47 is ohmically connected to the sub-collector layer 102. An anode electrode 81 formed on the emitter layer 105 of each of the diodes 47 penetrates through the emitter layer 105 and is ohmically connected to the base layer 104. A via-hole connecting pad 74 is formed on the element isolation region 108 on the lateral side of one of the diodes 47.

The interlayer insulating film 109 is formed over the entire region of the substrate 40 so as to cover the diodes 47 and the via-hole connecting pad 74. Contact holes are formed at predetermined positions of the interlayer insulating film 109, for example, at positions where the cathode electrodes 80, the anode electrodes 81, and the via-hole connecting pad 74 are disposed. A plurality of wiring lines 111 formed on the interlayer insulating film 109 connect the cathode electrodes 80 and the anode electrodes 81 of the diodes 47 to thereby connect the diodes 47 in series. Another wiring line 111 connects the cathode electrode 80 at an end portion of a series circuit formed by the diodes 47 and the via-hole connecting pad 74. The anode electrode 81 at an end portion of the series circuit formed by the diodes 47 is connected to the collector electrode 70 of the HBT 41 (FIG. 1B) by another wiring line 111.

The interlayer insulating film 112 is formed over the entire region of the substrate 40 so as to cover the wiring lines 111. A first metal film 120 for bonding pads is formed on the interlayer insulating film 112. The first metal film 120 is disposed at a position which partially overlaps the plurality of diodes 47.

The protective film 121 is formed on the first metal film 120 and the interlayer insulating film 112. A plurality of openings 122 for bonding are formed in the protective film 121. The openings 122 are disposed at positions which are located inside the first metal film 120 in plan view and which partially overlap the plurality of diodes 47.

A seed electrode layer 127 for plating is formed so as to cover the bottom surface and the side surface of each of the openings 122. The seed electrode layer 127 extends to a frame-like region of the upper surface of the protective film 121, the frame-like region surrounding the opening 122. A second metal film 130 and a third metal film 131 for bonding pads are stacked on the seed electrode layer 127 in this order. The first metal film 120, the second metal film 130, and the third metal film 131 form bonding pads 140.

The metal material of the second metal film 130 is harder than the metal material of the first metal film 120. The hardness of the metal materials can be defined by, for example, Vickers hardness, Young's modulus, etc. The third metal film 131 is formed of the same metal material as the first metal film 120. For example, the first metal film 120 and the third metal film 131 are formed of (e.g., includes) gold (Au), and the second metal film 130 is formed of (e.g., includes) copper (Cu).

A via-hole 44 is formed to extend from the back surface of the substrate 40 to the via-hole connecting pad 74. A back-surface electrode 45 formed on the back surface of the substrate 40 is connected to the via-hole connecting pad 74 through the via-hole 44.

Figure 2:
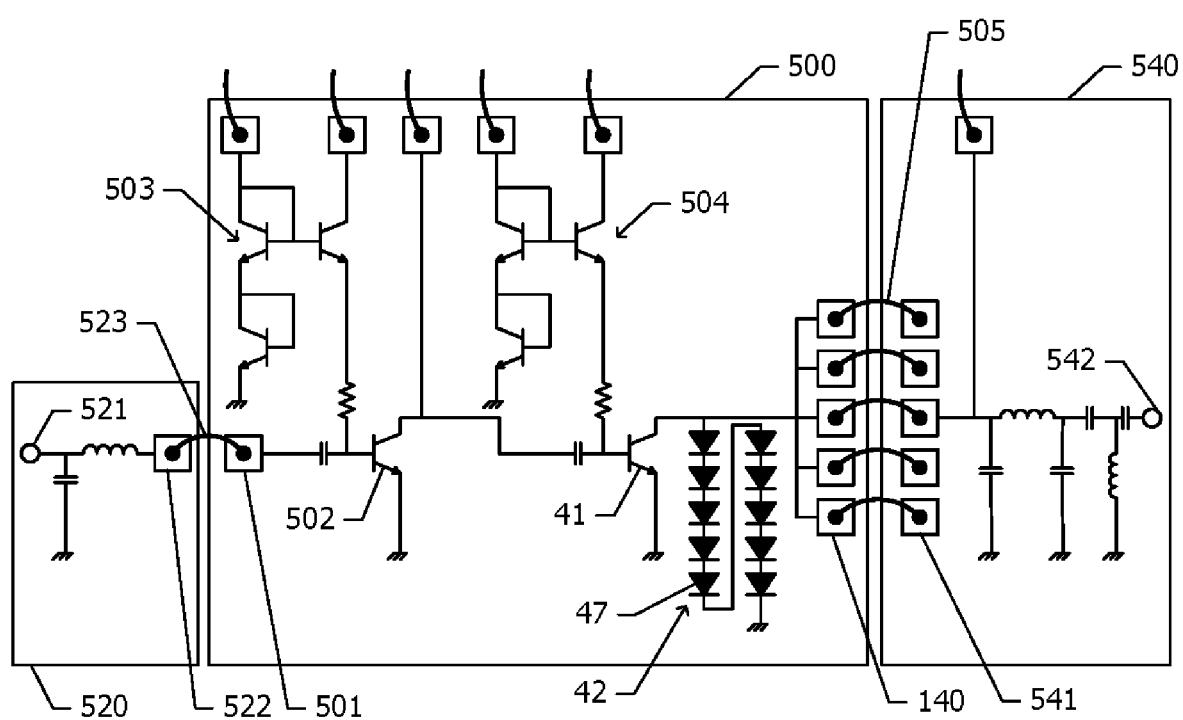
FIG. 2 is an equivalent circuit diagram of a power amplifier module including a semiconductor device according to the first embodiment.

FIG. 2 is an equivalent circuit diagram of a power amplifier module including a semiconductor device according to the first embodiment. The power amplifier module includes an input matching circuit 520, a semiconductor device 500, and an output matching circuit 540.

The semiconductor device 500 includes an initial-stage HBT 502 and an output-stage HBT 41 that constitute a power amplifier circuit. An input signal is input to a bonding pad 501 for signal input. The input signal is input to a base electrode of the initial-stage HBT 502. The output of the initial-stage HBT 502 is input to the base electrode 71 (FIG. 1B) of the output-stage HBT 41.

Bias circuits 503 and 504 respectively supply the initial-stage HBT 502 and the output-stage HBT 41 with a bias current. A protection circuit 42 is connected between the collector and the emitter of the output-stage HBT 41. The protection circuit 42 includes a plurality of, for example 10, diodes 47 connected in series. The collector of the output-stage HBT 41 is connected to a plurality of bonding pads 140 serving as output terminals.

A high-frequency signal is input to an input terminal 521 of the input matching circuit 520. A bonding pad 522 for signal output of the input matching circuit 520 is connected to the bonding pad 501 for signal input of the semiconductor device 500 with a bonding wire 523 therebetween.

The bonding pads 140 for signal output of the semiconductor device 500 are connected to a plurality of bonding pads 541 for signal input of the output matching circuit 540 with a plurality of bonding wires 505 therebetween. The high-frequency signal input to the input terminal 521 of the input matching circuit 520 is amplified in the semiconductor device 500 via the input matching circuit 520 and is output to an output terminal 542 via the output matching circuit 540.

Advantageous Effects of First Embodiment

Next, a significantly advantageous effect of the first embodiment will be described.

In the first embodiment, the protection circuit 42 (FIG. 1A) has a function of protecting the HBT 41 (FIG. 1B) from electrostatic breakdown, overvoltage breakdown, and load mismatch breakdown. Furthermore, in the first embodiment, since the protection circuit 42 (FIG. 1A) and the bonding pads 140 are disposed so as to partially overlap, it is not necessary to secure dedicated regions for arranging the bonding pads 140. With this structure, an increase in the chip area can be suppressed.

Next, another advantageous effect of the first embodiment will be described with reference to FIGS. 3A to 3D.

Figure 3A:
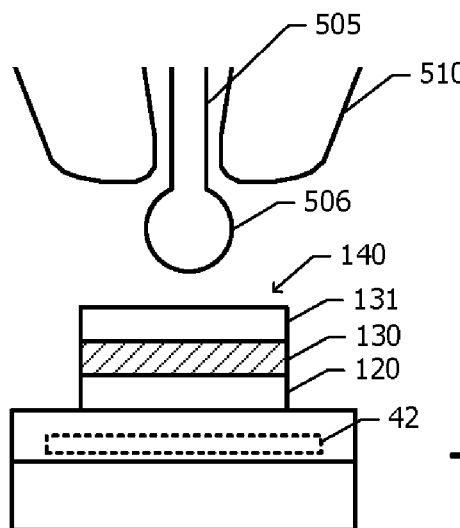
FIGS. 3A and 3B are schematic sectional views of a bonding pad of a semiconductor device according to the first embodiment before wire bonding and during wire bonding, respectively.
Figure 3B:
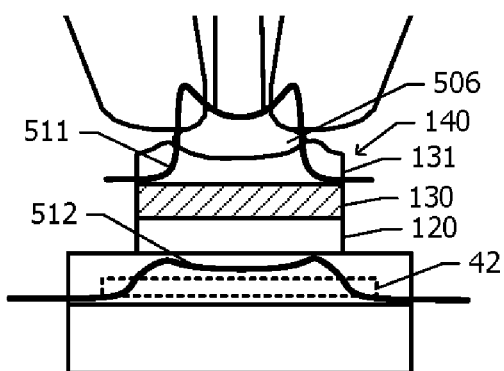

FIGS. 3A and 3B are schematic sectional views of a bonding pad 140 of the semiconductor device according to the first embodiment before wire bonding and during wire bonding, respectively.

A bonding wire 505 is supported by a capillary 510. For example, a gold (Au) wire is used as the bonding wire 505. A metal ball 506 is formed at an end of the bonding wire 505. When the capillary 510 is pressed onto the bonding pad 140, and heat or ultrasonic waves are applied, a third metal film 131 of the bonding pad 140 and the metal ball 506 are deformed and bonded to each other. A relatively large stress is generated in the third metal film 131 along the outer periphery of the metal ball 506. A curve 511 illustrates the distribution of the stress applied to the third metal film 131.

The stress generated in the third metal film 131 is transferred to a protection circuit 42 through a second metal film 130, which is relatively hard. Since the second metal film 130 functions as a stress dispersion sheet, the distribution of the stress generated in the protection circuit 42 located below the second metal film 130 is gentler than the distribution of the stress generated in the third metal film 131. A curve 512 illustrates the distribution of the stress generated in the protection circuit 42.

Figure 3C:
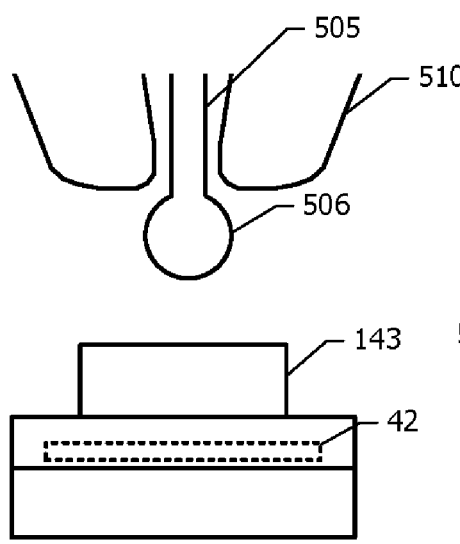
FIGS. 3C and 3D are schematic sectional views of a bonding pad of a semiconductor device according to a comparative example before wire bonding and during wire bonding, respectively.
Figure 3D:
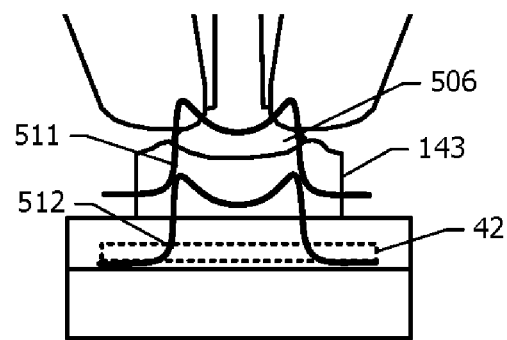

FIGS. 3C and 3D are schematic sectional views of a bonding pad 143 of a semiconductor device according to a comparative example before wire bonding and during wire bonding, respectively. In the comparative example, the bonding pad 143 includes a single metal film made of the same metal material as the first metal film 120 and the third metal film 131 (FIGS. 3A and 3B). Since the bonding pad 143 is softer than the second metal film 130 (FIGS. 3A and 3B), the function of dispersing a stress is low in the bonding pad 143. Accordingly, as illustrated in a curve 512, a large stress is generated in the protection circuit 42 along the outer periphery of the metal ball 506. In the portion where a large stress is generated, damage of a circuit element constituting the protection circuit 42 easily occurs.

In the first embodiment, since the second metal film 130 of the bonding pad 140 functions as a stress dispersion sheet, damage of the protection circuit 42 is unlikely to occur during bonding. Furthermore, since a metal material that is softer than the second metal film 130 is used as the third metal film 131, good electrical connection between the bonding wire 505 and the bonding pad 140 can be reliably established.

From the viewpoint of obtaining a stable contact interface, the first metal film 120 is preferably formed of the same metal material as the wiring line 111 (FIGS. 1B and 1C) disposed thereunder. When a circuit element is formed by using a compound semiconductor, Au is typically used as the wiring line 111. Accordingly, Au is preferably used as the first metal film 120.

Next, metal materials suitable for the second metal film 130 of the bonding pad 140 will be described with reference to FIG. 4. In order to enhance the effect of the stress dispersion sheet, the second metal film 130 is preferably made of a metal material that is harder than the first metal film 120. Herein, the term "hard" means that Vickers hardness is high or Young's modulus is high. Furthermore, from the viewpoint that the second metal film 130 forms a part of the bonding pad 140, a metal material having a low electrical resistivity is preferably used.

FIG. 4 is a table listing Vickers hardness, Young's modulus, and electrical resistivity of various metals. The values of Vickers hardness shown in FIG. 4 are values measured with the same test force for all the metals.

When Au is used as the first metal film 120, the second metal film 130 is preferably formed of a metal material having a higher Vickers hardness or a higher Young's modulus than gold (Au). For example, a metal material having a Vickers hardness of higher than 30 HV or a metal material having a Young's modulus of higher than 90 GPa is preferably used as the second metal film 130. Examples of the metal material having a higher Vickers hardness or Young's modulus than Au and having an electrical resistivity that is not significantly high include copper (Cu), nickel (Ni), and molybdenum (Mo). The second metal film 130 is preferably formed of Cu, Ni, or Mo.

When the bonding pad 140 has a large thickness enough to disperse the stress, the effect due to interposition of the hard second metal film 130 (FIG. 1C) is small. A significant effect due to interposition of the second metal film 130 is obtained when the bonding pad 140 has a thickness of 10 μm or less.

Modification of First Embodiment

In the first embodiment, the bonding pads 140 (FIG. 1A) partially overlap the diodes 47 (FIG. 1C) that constitute the protection circuit 42. Alternatively, the bonding pads 140 may overlap the HBT 41 (FIGS. 1A and 1B). As illustrated in FIG. 2, circuit elements such as a capacitor and a resistive element are formed on the substrate 40 (FIGS. 1B and 1C). The bonding pads 140 may partially overlap these circuit elements. Active elements other than HBTs, for example, field-effect transistors such as high electron mobility transistors (HEMTs) and metal-semiconductor field-effect transistors (MESFETs) may be formed on the substrate 40 made of a compound semiconductor. The bonding pads 140 may partially overlap these active elements formed by using compound semiconductors.

FIG. 1A illustrates an example in which the number of the bonding pads 140 is 3. However, the number of the bonding pads 140 is not limited to 3, and at least one bonding pad 140 may be disposed. FIG. 2 illustrates an example in which the number of the output-stage HBT 41 is 1. However, in general, a plurality of HBTs that are connected in parallel constitute the output stage.

A diffusion barrier layer may be disposed at an interface between the second metal film 130 (FIG. 1C) made of Cu and the third metal film 131 (FIG. 1C) made of Au. For example, TiW or Ni can be used as the diffusion barrier layer.

In the first embodiment, a GaAs substrate is used as the substrate 40. Alternatively, other compound semiconductor substrates may be used. For example, an InP substrate may be used as the substrate 40.

In the first embodiment, for example, the first metal film 120 and the second metal film 130 have the same thickness. However, the thickness of the second metal film 130 is preferably equal to or larger than the thickness of the first metal film 120. By increasing the thickness of the second metal film 130, the function of the second metal film 130 as a stress dispersion sheet can be enhanced.

Second Embodiment

Next, a semiconductor device according to a second embodiment will be described with reference to FIG. 5. Hereinafter, a description of configurations common to the configurations of the semiconductor device according to the first embodiment is omitted.

Figure 5:
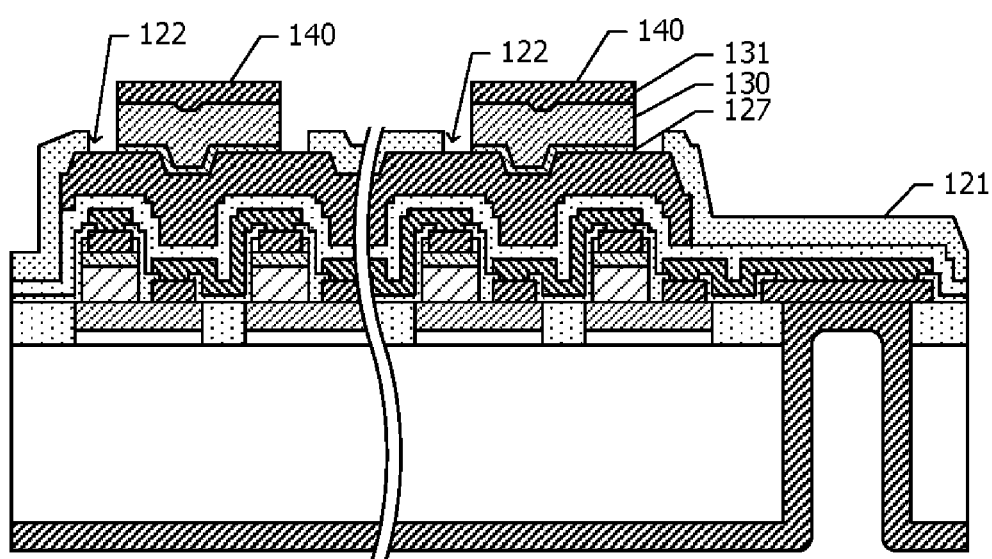
FIG. 5 is a sectional view of a semiconductor device according to a second embodiment.

FIG. 5 is a sectional view of a semiconductor device according to the second embodiment. In the first embodiment, as illustrated in FIG. 1C, the second metal film 130 and the third metal film 131 of the bonding pad 140 extend to the outside of the edge of the opening 122, and an outer peripheral portion thereof overlaps the protective film 121. In contrast, in the second embodiment, a second metal film 130 and a third metal film 131 are disposed inside an opening 122 in plan view. Specifically, the second metal film 130 and the third metal film 131 do not overlap a protective film 121. A seed electrode layer 127 is also disposed inside the opening 122 in plan view.

In the second embodiment, even when a load is applied to the second metal film 130 and the third metal film 131 of the bonding pad 140 during bonding, the load is not applied to the protective film 121. With this structure, a mechanical stress applied to the protective film 121 during bonding can be reduced. As a result, generation of cracks in the protective film 121 can be suppressed.

Third Embodiment

Next, a semiconductor device according to a third embodiment will be described with reference to FIG. 6. Hereinafter, a description of configurations common to the configurations of the semiconductor device according to the second embodiment is omitted.

Figure 6:
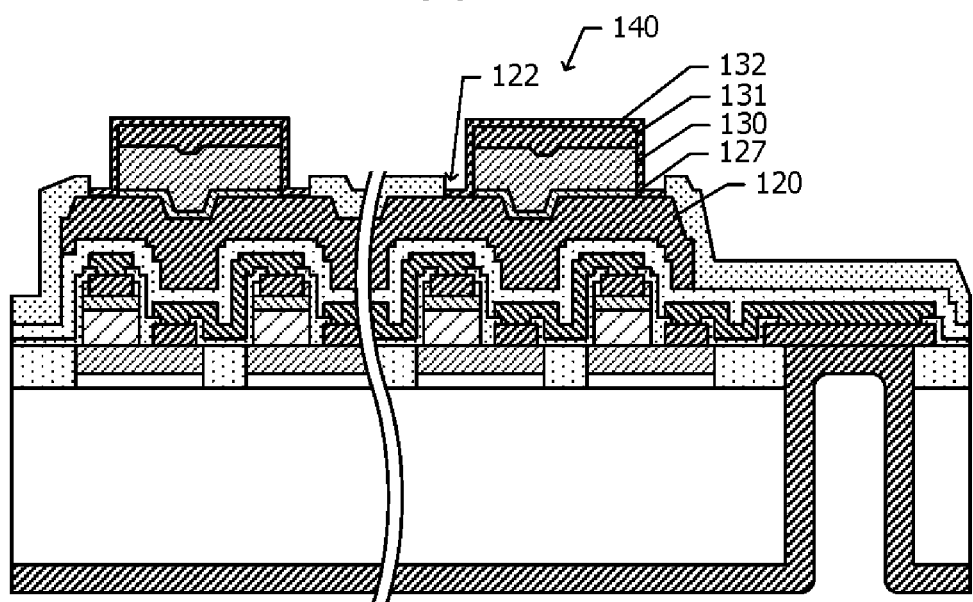
FIG. 6 is a sectional view of a semiconductor device according to a third embodiment.

FIG. 6 is a sectional view of a semiconductor device according to the third embodiment. In the second embodiment, side surfaces and an upper surface of a multilayer structure including the seed electrode layer 127, the second metal film 130, and the third metal film 131 (FIG. 5) of the bonding pad 140 are exposed. In the third embodiment, side surfaces and an upper surface of a multilayer structure including a seed electrode layer 127, a second metal film 130, and a third metal film 131 are covered with a fourth metal film 132. The fourth metal film 132 further covers a region of an upper surface of a first metal film 120 in an opening 122, the region not having the seed electrode layer 127 thereon. The fourth metal film 132 is formed of, for example, the same metal material as the third metal film 131.

In the third embodiment, a contact surface of dissimilar metals of the second metal film 130 and the third metal film 131 is not exposed. With this structure, galvanic corrosion can be suppressed particularly in a high-humidity environment.

Next, a method for producing a semiconductor device according to the third embodiment will be described with reference to FIGS. 7A and 7B to FIGS. 30A and 30B. The method for producing a semiconductor device according to the third embodiment can be applied also to the production of the semiconductor devices according to the first embodiment and the second embodiment.

FIGS. 7A and 7B to FIGS. 30A and 30B are sectional views of a semiconductor device according to the third embodiment during its production. In the drawings from FIGS. 7A and 7B to FIGS. 30A and 30B, figures suffixed with A correspond to sectional views taken along dash-dotted line 1B-1B of FIG. 1A, and figures suffixed with B correspond to sectional views taken along dash-dotted line 1C-1C of FIG. 1A.

Figure 7A:
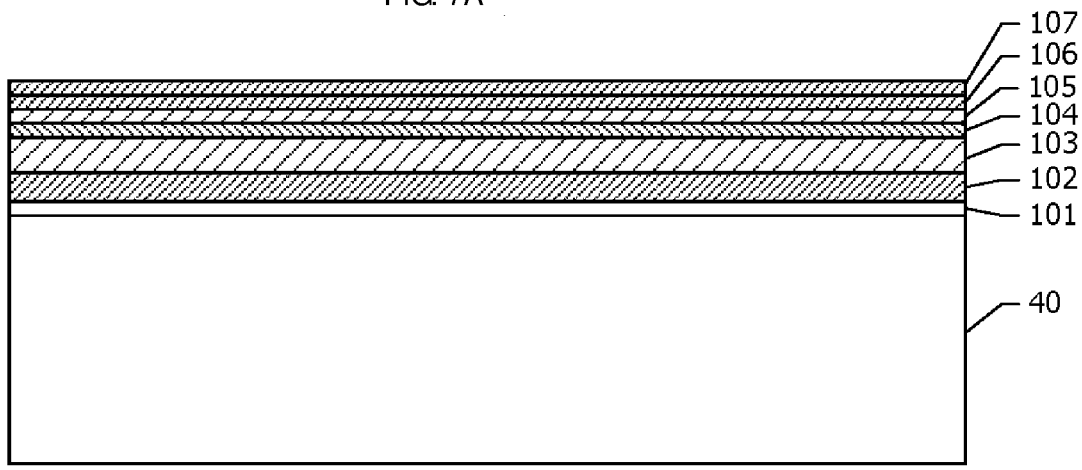
FIGS. 7A and 7B are sectional views of a semiconductor device according to the third embodiment during its production.
Figure 7B:
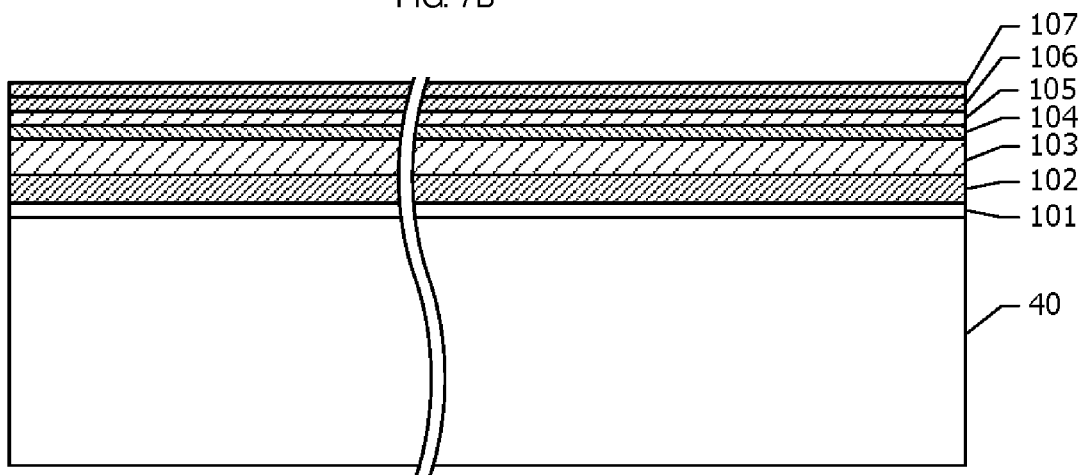

As illustrated in FIGS. 7A and 7B, a buffer layer 101, a sub-collector layer 102, a collector layer 103, a base layer 104, an emitter layer 105, and contact layers 106 and 107 are sequentially epitaxially grown on a substrate 40 made of semi-insulating GaAs. For example, a metal-organic vapor phase epitaxy (MOVPE) can be used to form these semiconductor layers. The substrate 40 has as an upper surface having an off-angle of 4° or less from a (100) plane.

Next, a description will be made of an example of the materials, the doping concentrations, and the film thicknesses of the semiconductor layers of the buffer layer 101 to the contact layer 107. The buffer layer 101 is formed of undoped GaAs and has a film thickness of 0.1 μm. The sub-collector layer 102 is formed of n-type GaAs, has a doping concentration of Si of $5\times10^{18}$ cm$^{-3}$, the Si being an n-type dopant, and has a film thickness of 0.6 μm. The collector layer 103 is formed of n-type GaAs, has a doping concentration of Si of $1\times10^{16}$ cm$^3$, and has a film thickness of 1.0 μm. The base layer 104 is formed of p-type GaAs, has a doping concentration of C of $5\times10^{19}$ cm$^{-3}$, the C being a p-type dopant, and has a film thickness of 96 nm. The emitter layer 105 is formed of n-type InGaP, has a molar ratio of InP of 0.48, has a doping concentration of Si of $4\times10^{17}$ cm$^{-3}$, and has a film thickness of 35 nm. The contact layer 106 is formed of n-type GaAs, has a doping concentration of Si of $5\times10^{18}$ cm$^{-3}$, and has a film thickness of 50 nm. The upper contact layer 107 is formed of n-type InGaAs, has a molar ratio of InAs of 0.5, has a doping concentration of Si of $1\times10^{19}$ cm$^3$, and has a film thickness of 50 nm.

Figure 8A:
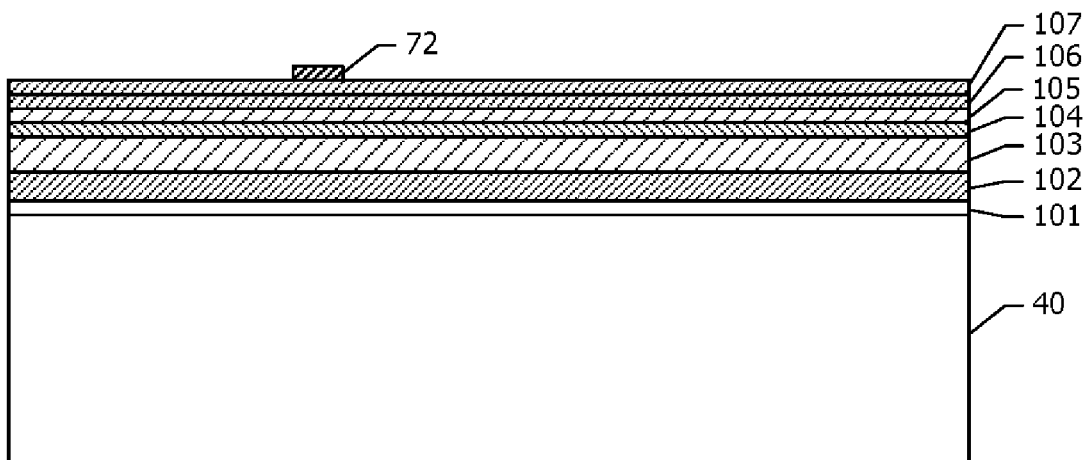
FIGS. 8A and 8B are sectional views of a semiconductor device according to the third embodiment during its production.
Figure 8B:
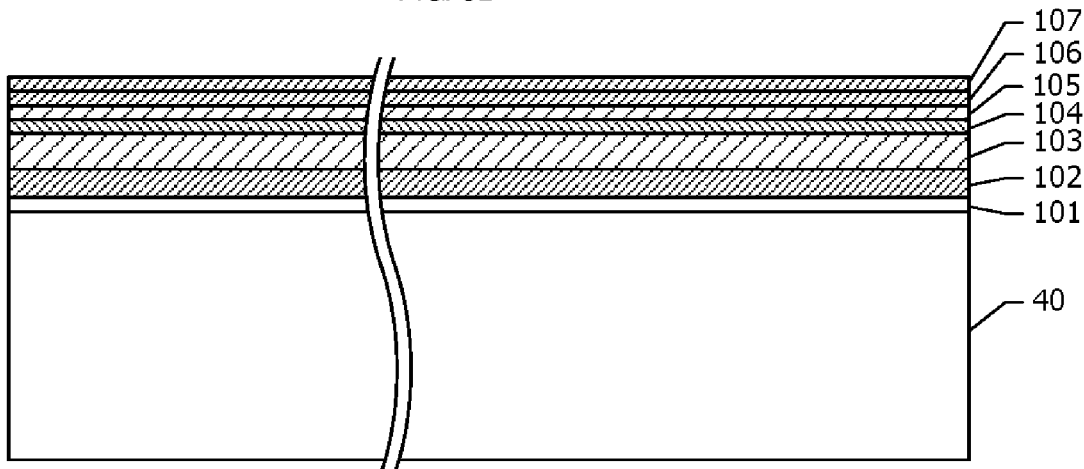

As illustrated in FIG. 8A, an emitter electrode 72 is formed on a predetermined region of the contact layer 107. The emitter electrode 72 is not disposed on the section illustrated in FIG. 8B. The emitter electrode 72 has a four-layer structure in which a Mo film having a thickness of 10 nm, a Ti film having a thickness of 5 nm, a Pt film having a thickness of 30 nm, and a Au film having a thickness of 200 nm are sequentially stacked from the substrate 40 side. The emitter electrode 72 can be formed by vapor deposition and a lift-off method.

Figure 9A:
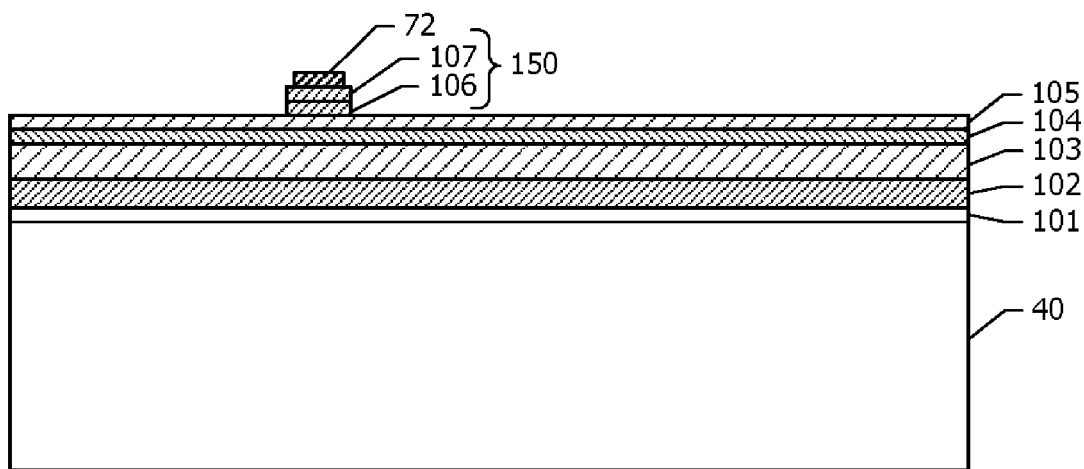
FIGS. 9A and 9B are sectional views of a semiconductor device according to the third embodiment during its production.
Figure 9B:
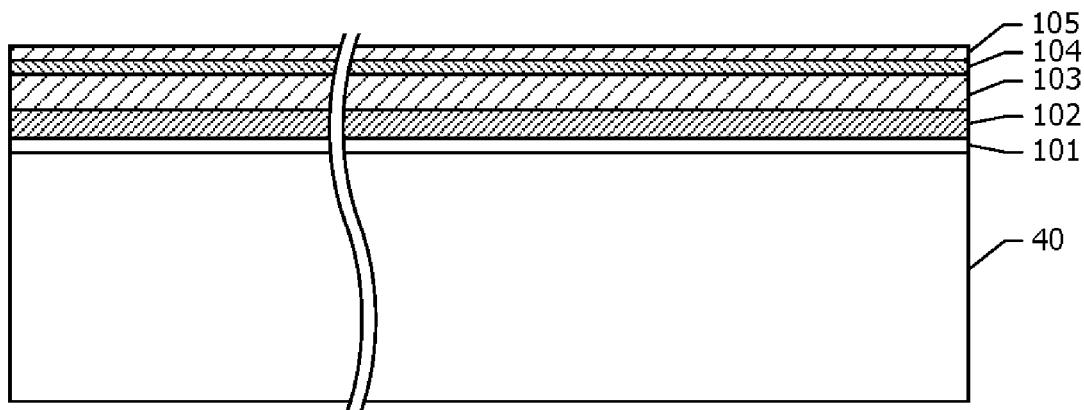

As illustrated in FIG. 9A, the contact layers 107 and 106 are processed to have a predetermined shape to form an emitter region 150. The emitter electrode 72 is disposed on the emitter region 150. In the section illustrated in FIG. 9B, the contact layers 107 and 106 are removed to expose the emitter layer 105. The contact layers 107 and 106 can be processed by photolithography and wet etching. This wet etching can be performed by using, for example, an etchant prepared by mixing phosphoric acid, a hydrogen peroxide solution, and water. Specifically, for example, an etchant prepared by mixing phosphoric acid having a concentration of 85% by weight, a hydrogen peroxide solution having a concentration of 35% by weight, and water in a volume ratio of 1:2:40 can be used. This etchant has a selectivity for selectively etching the contact layers 107 and 106 made of GaAs without substantially etching the emitter layer 105 made of InGaP.

Figure 10A:
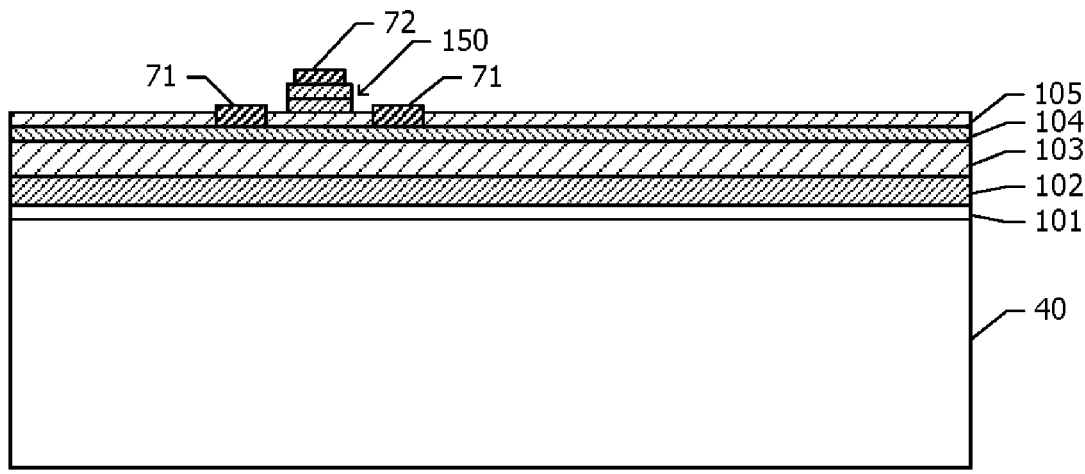
FIGS. 10A and 10B are sectional views of a semiconductor device according to the third embodiment during its production.

As illustrated in FIG. 10A, a base electrode 71 is formed on both sides of the emitter region 150. The base electrode 71 is formed by forming a metal film on the emitter layer 105 by photolithography, vapor deposition, and a lift-off method and then performing sintering. Thus, the base electrode 71 penetrates through the emitter layer 105 and is ohmically connected to the base layer 104. The metal film for forming the base electrode 71 includes a Pt film having a thickness of 30 nm, a Ti film having a thickness of 50 nm, a Pt film having a thickness of 50 nm, and a Au film having a thickness of 200 nm which are sequentially stacked from the substrate 40 side.

Figure 10B:
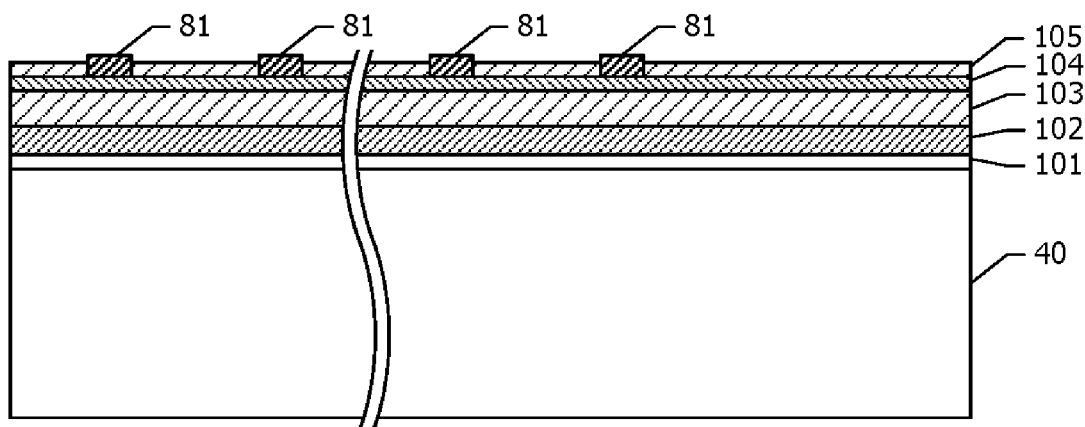

As illustrated in FIG. 10B, a plurality of anode electrodes 81 are formed at the same time when the base electrode 71 (FIG. 10A) is formed. The anode electrodes 81 also penetrate through the emitter layer 105 and are ohmically connected to the base layer 104.

Figure 11A:
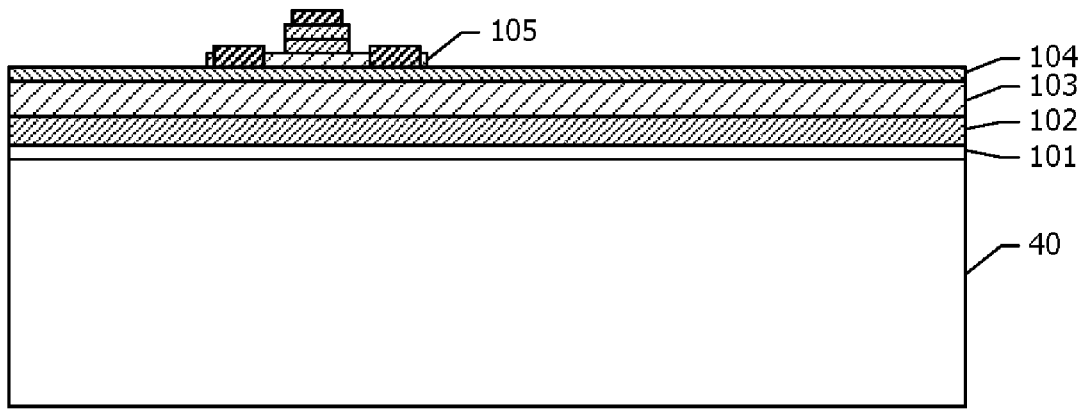
FIGS. 11A and 11B are sectional views of a semiconductor device according to the third embodiment during its production.
Figure 11B:
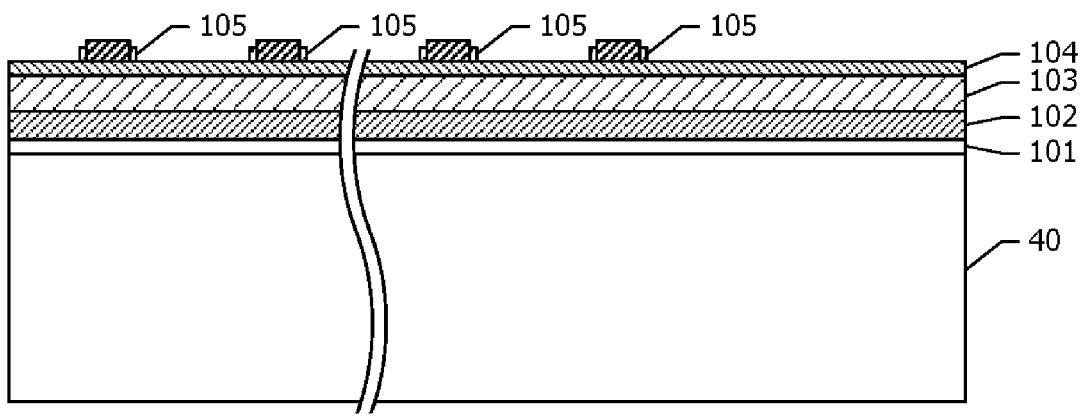

As illustrated in FIGS. 11A and 11B, unnecessary portions of the emitter layer 105 are removed by photolithography and wet etching. As a result, the base layer 104 is exposed. For example, hydrochloric acid can be used as an etchant. Hydrochloric acid has a selectivity for selectively etching the emitter layer 105 made of InGaP without substantially etching the base layer 104 made of GaAs.

Figure 12A:
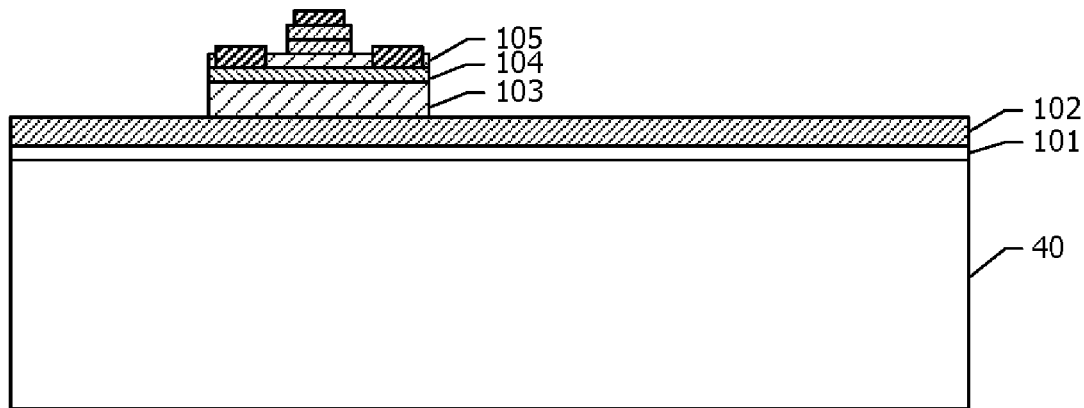
FIGS. 12A and 12B are sectional views of a semiconductor device according to the third embodiment during its production.
Figure 12B:
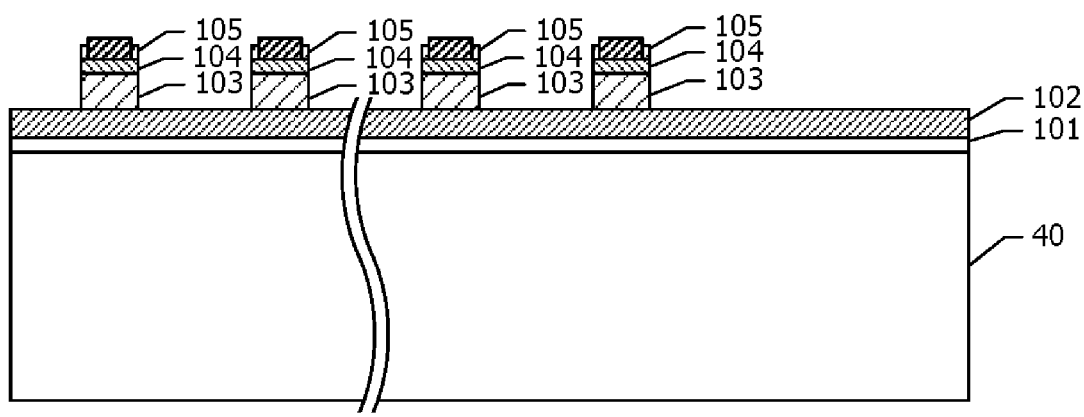

As illustrated in FIGS. 12A and 12B, unnecessary portions of the base layer 104 and the collector layer 103 are removed by using the etching mask used in the etching of the emitter layer 105. As a result, the sub-collector layer 102 is exposed. For the etching of the base layer 104 and the collector layer 103, the same etchant as the etchant used in the etching of the contact layers 107 and 106 (FIGS. 9A and 9B) can be used. Stopping of the etching is performed by controlling the time.

Figure 13A:
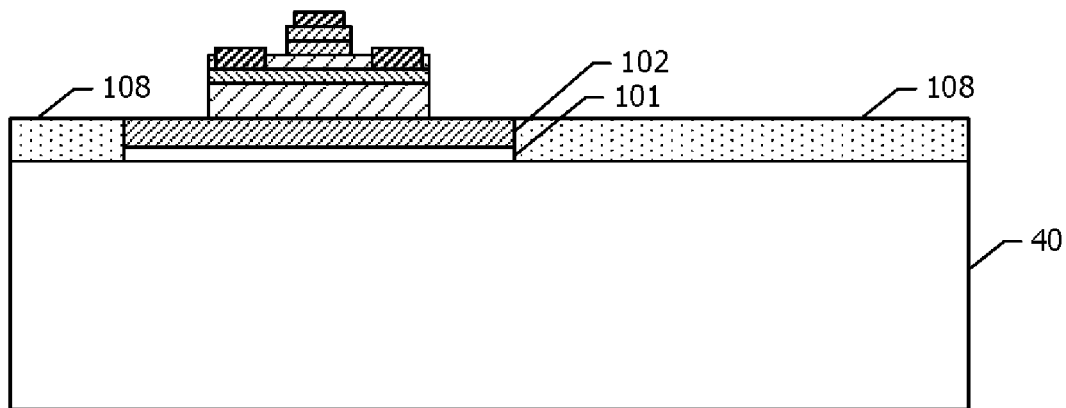
FIGS. 13A and 13B are sectional views of a semiconductor device according to the third embodiment during its production.
Figure 13B:
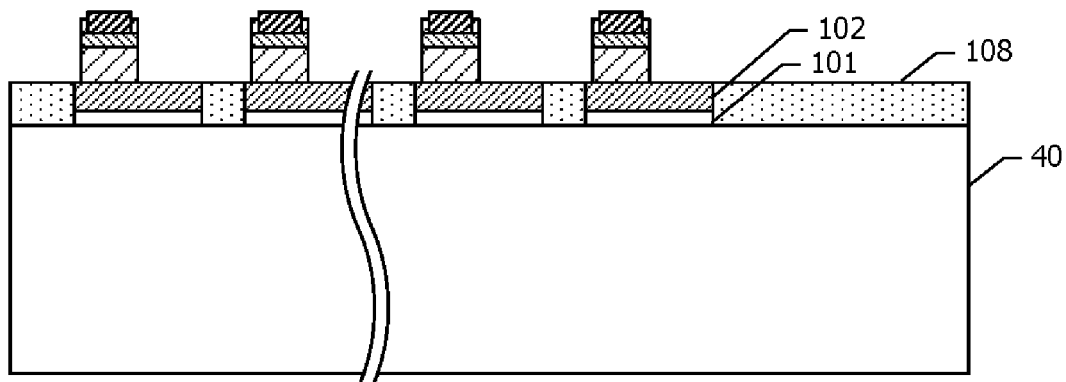

As illustrated in FIGS. 13A and 13B, element isolation regions 108 for ensuring electrical insulation between elements are formed. The element isolation regions 108 can be formed by, for example, ion implantation of boron into the sub-collector layer 102 and the buffer layer 101.

Figure 14A:
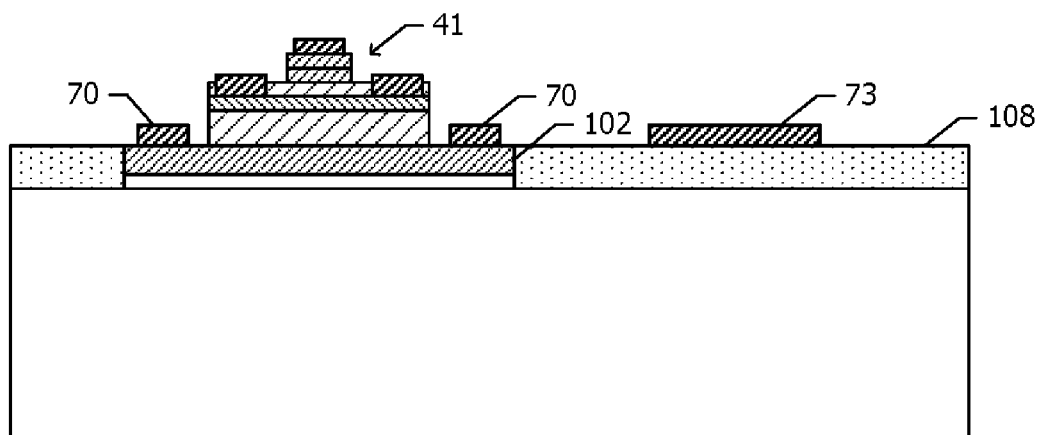
FIGS. 14A and 14B are sectional views of a semiconductor device according to the third embodiment during its production.
Figure 14B:
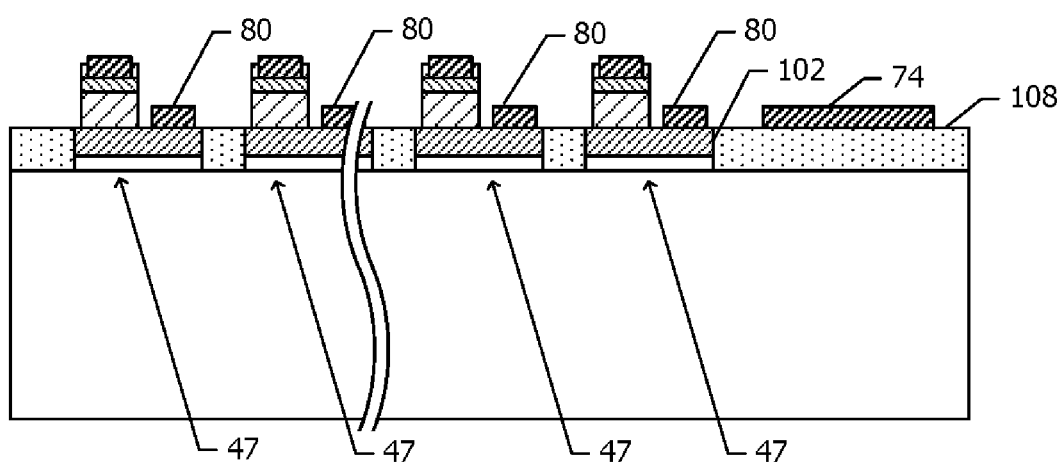

As illustrated in FIGS. 14A and 14B, a collector electrode 70 is formed on the sub-collector layer 102 of an HBT 41 (FIG. 1B), and cathode electrodes 80 are formed on the sub-collector layer 102 of diodes 47 (FIG. 1B) at the same time. Furthermore, via-hole connecting pads 73 and 74 are formed on the element isolation region 108. The collector electrode 70, the cathode electrodes 80, and the via-hole connecting pads 73 and 74 can be formed by using photolithography, vapor deposition, and a lift-off method. The collector electrode 70, the cathode electrodes 80, and the via-hole connecting pads 73 and 74 include a AuGe film having a thickness of 60 nm, a Ni film having a thickness of 10 nm, and a Au film having a thickness of 200 nm which are sequentially stacked from the substrate 40 side.

Figure 15A:
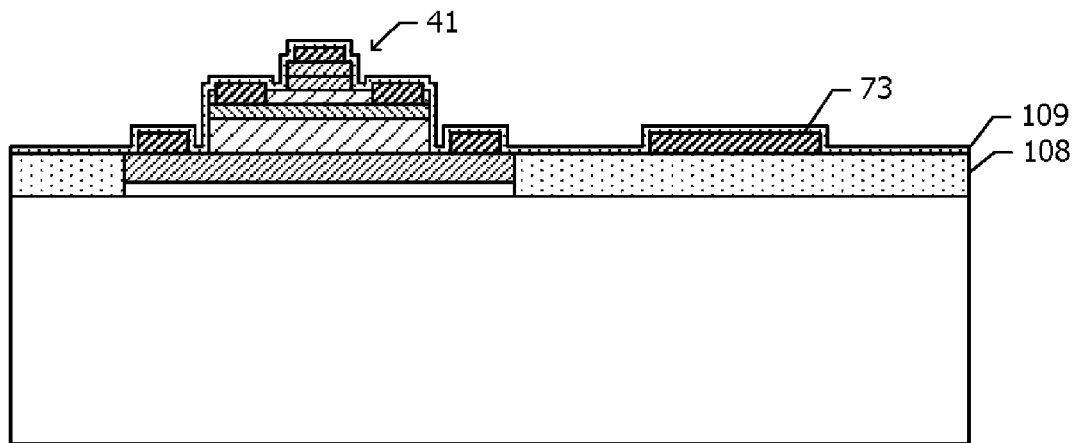
FIGS. 15A and 15B are sectional views of a semiconductor device according to the third embodiment during its production.
Figure 15B:
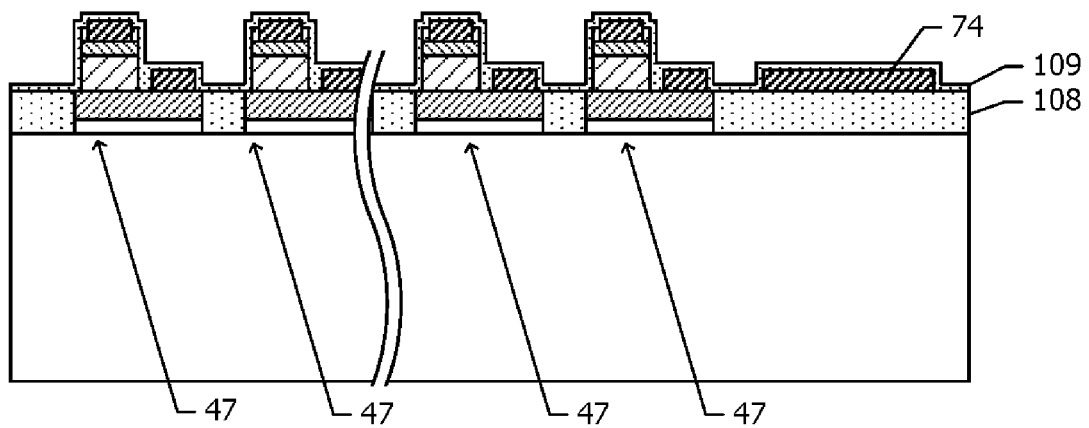

As illustrated in FIGS. 15A and 15B, an interlayer insulating film 109 is deposited over the entire region of the substrate 40 so as to cover the HBT 41, the diodes 47, and the via-hole connecting pads 73 and 74. The interlayer insulating film 109 is formed of, for example, SiN and has a thickness of 100 nm. For example, chemical vapor deposition (CVD) can be used to deposit the interlayer insulating film 109.

Figure 16A:
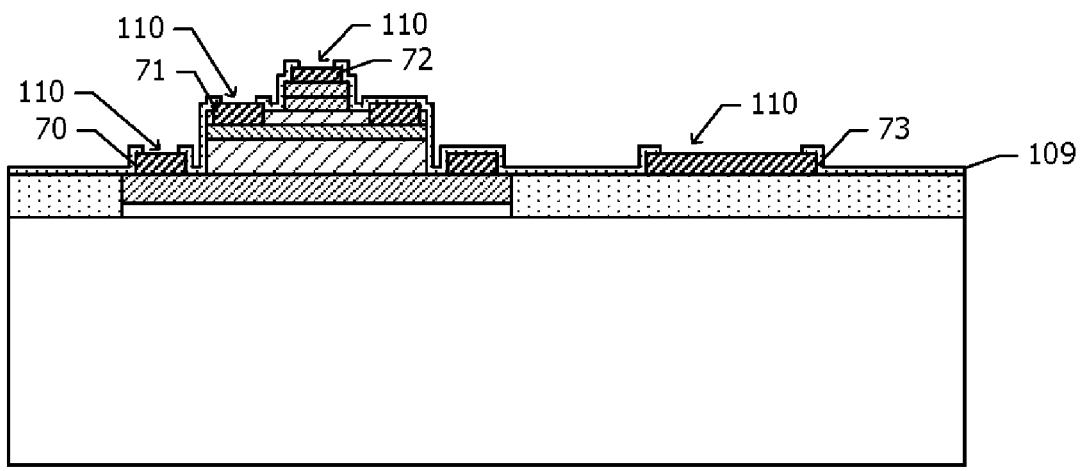
FIGS. 16A and 16B are sectional views of a semiconductor device according to the third embodiment during its production.
Figure 16B:
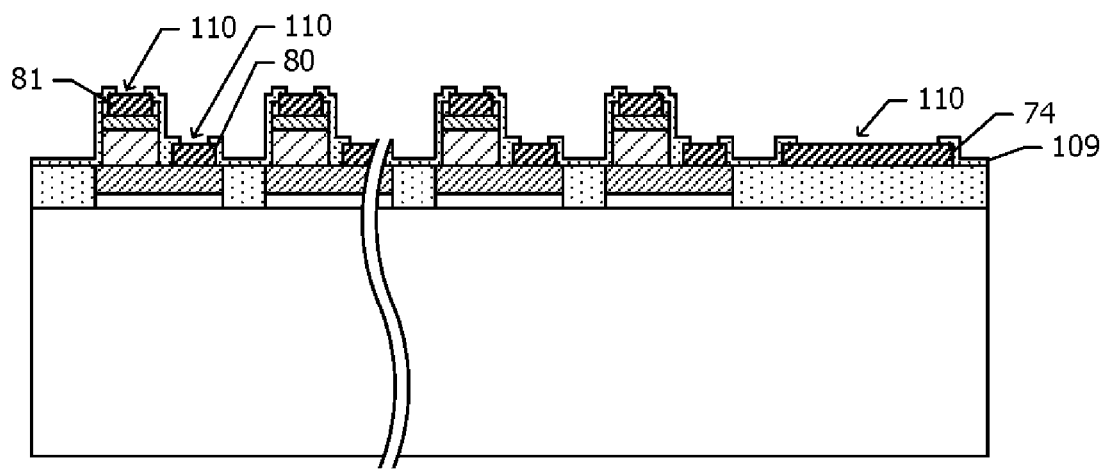

As illustrated in FIGS. 16A and 16B, a plurality of openings 110 are formed at predetermined positions of the interlayer insulating film 109. The openings 110 are disposed inside the collector electrode 70, the base electrode 71, the emitter electrode 72, the cathode electrodes 80, the anode electrodes 81, and the via-hole connecting pads 73 and 74 in plan view and expose partial regions of the upper surfaces of these. The openings 110 can be formed by using photolithography and dry etching.

Figure 17A:
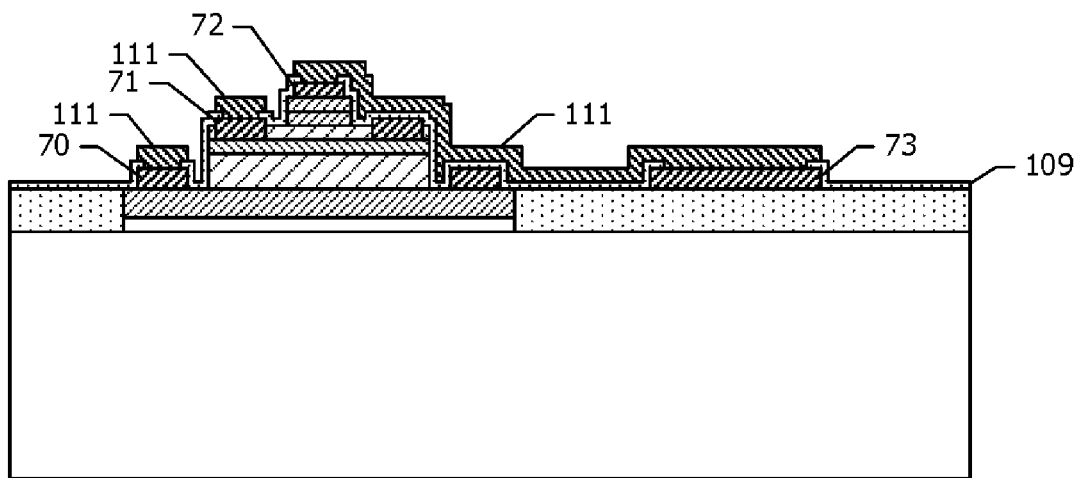
FIGS. 17A and 17B are sectional views of a semiconductor device according to the third embodiment during its production.
Figure 17B:
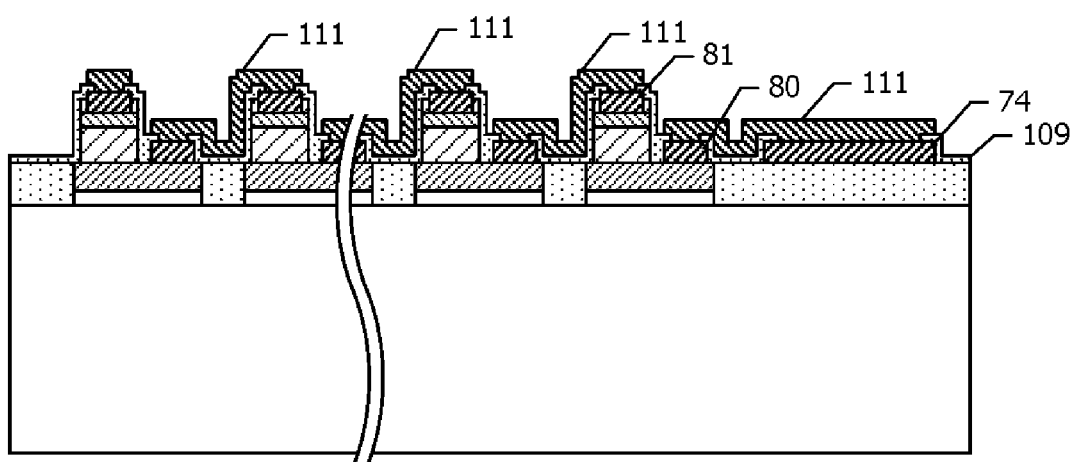

As illustrated in FIGS. 17A and 17B, a plurality of wiring lines 111 are formed on the interlayer insulating film 109. The wiring lines 111 are formed of, for example, Au and each have a thickness of 1 μm. The wiring lines 111 can be formed by using photolithography, vapor deposition, and a lift-off method. One of the wiring lines 111 connects the emitter electrode 72 and the via-hole connecting pad 73. Another one of the wiring lines 111 connects the cathode electrode 80 of one diode 47 and the via-hole connecting pad 74. Another one of the wiring lines 111 connects the anode electrode 81 of one diode 47 and a cathode electrode 80 of a diode 47 adjacent to the one diode 47. Furthermore, the base electrode 71 and the collector electrode 70 are each also connected to the corresponding wiring line 111.

Figure 18A:
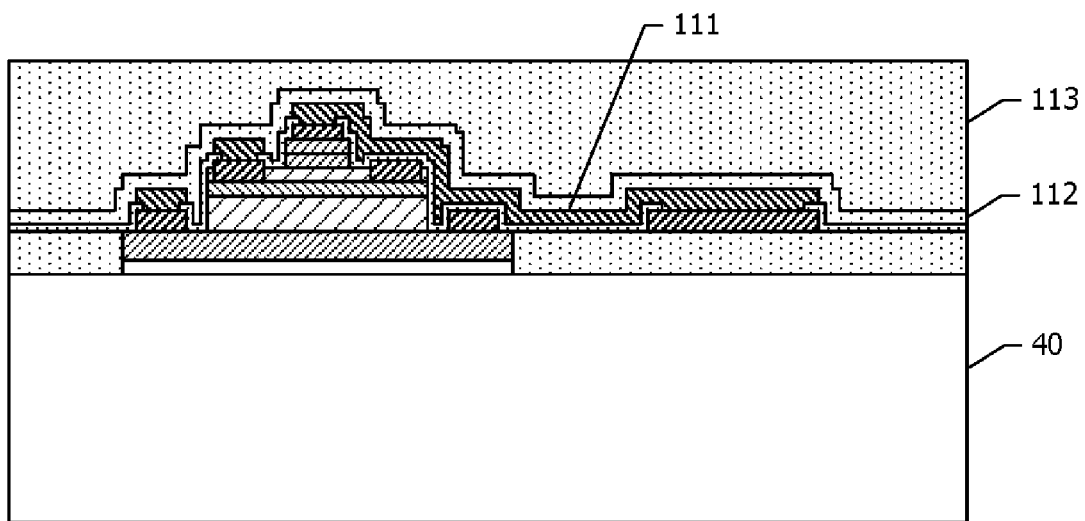
FIGS. 18A and 18B are sectional views of a semiconductor device according to the third embodiment during its production.
Figure 18B:
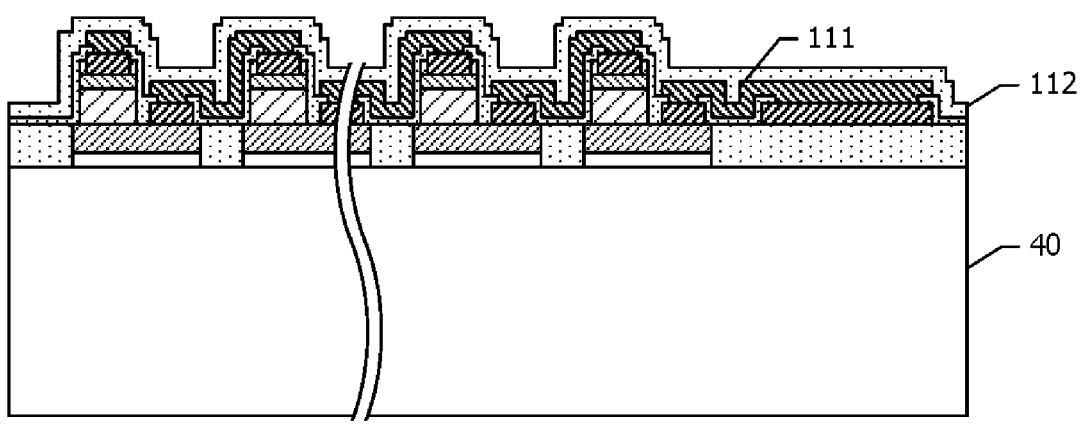

As illustrated in FIG. 18A, an interlayer insulating film 112 is formed over the entire region of the substrate 40 so as to cover the wiring lines 111. The interlayer insulating film 112 is formed of, for example, SiN. Furthermore, an interlayer insulating film 113 is formed on the interlayer insulating film 112. The interlayer insulating film 113 is formed by, for example, applying a polyimide to form a polyimide film having a thickness of 1.8 μm, and then planarizing the surface of the polyimide film. Subsequently, the interlayer insulating film 113 in regions where bonding pads 140 (FIG. 1A and FIG. 6) are to be disposed is removed. In the section illustrated in FIG. 18B, the interlayer insulating film 113 is removed, and the interlayer insulating film 112 made of SiN is exposed.

Figure 19A:
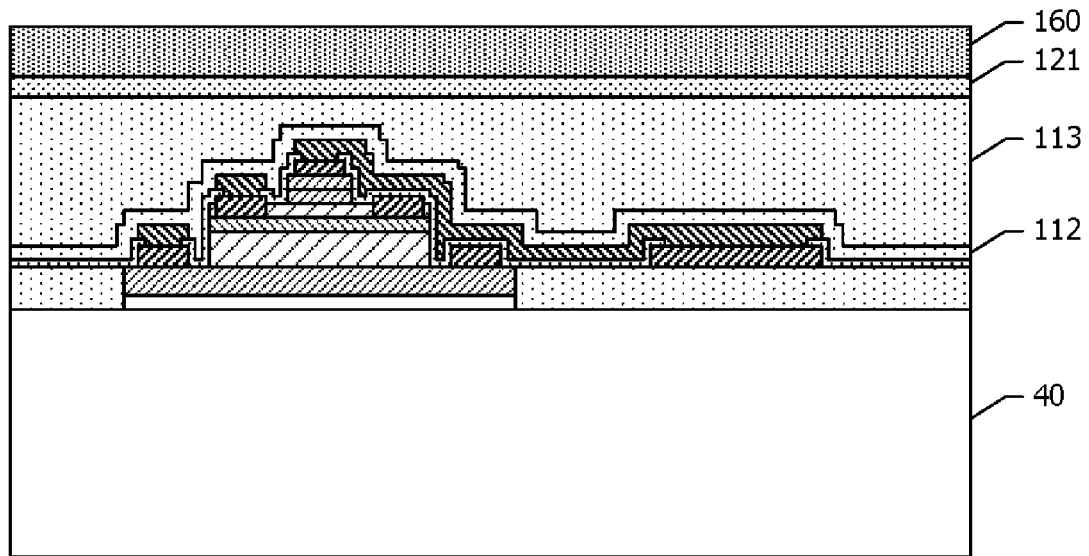
FIGS. 19A and 19B are sectional views of a semiconductor device according to the third embodiment during its production.
Figure 19B:
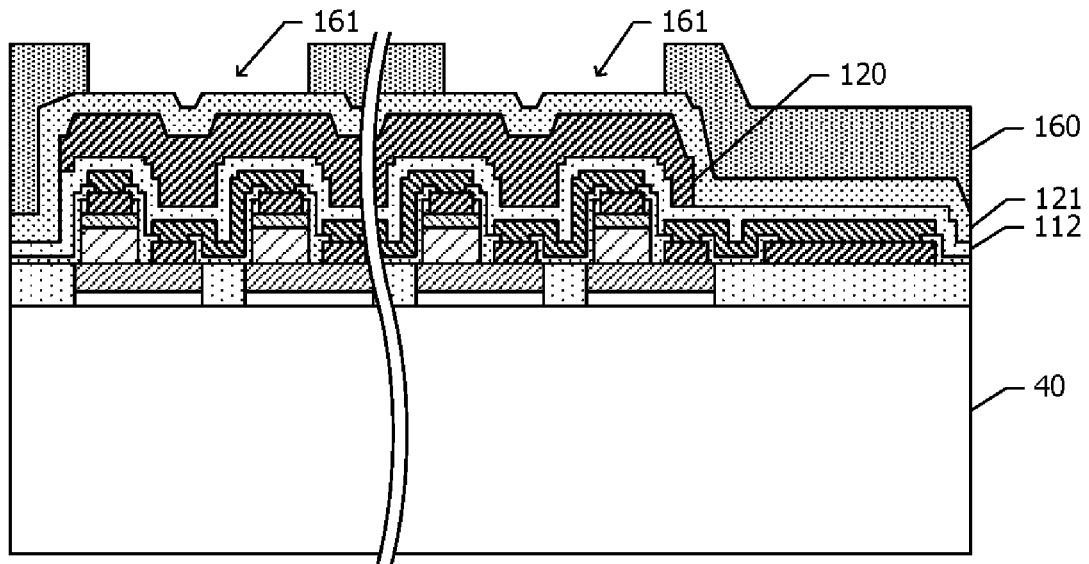

As illustrated in FIG. 19B, a first metal film 120 is formed on the interlayer insulating film 112. The first metal film 120 is disposed so as to partially overlap the plurality of diodes 47. The first metal film 120 is not formed in the section illustrated in FIG. 19A. The first metal film 120 is formed of, for example, Au and has a thickness of 2 μm. The first metal film 120 can be formed by using, for example, photolithography, vapor deposition, and a lift-off method. A second wiring line layer is formed in another region of the substrate 40 at the same time when the first metal film 120 is formed.

A protective film 121 made of SiN is formed over the entire region of the substrate 40 so as to cover the first metal film 120 illustrated in FIG. 19B. In the section illustrated in FIG. 19A, the protective film 121 is formed on the interlayer insulating film 113. The protective film 121 has a thickness of, for example, 500 nm. The protective film 121 can be formed by using, for example, a CVD method. A resist film 160 is formed on the protective film 121, and openings 161 are formed in regions where bonding pads 140 (FIG. 1A and FIG. 6) are to be formed.

Figure 20A:
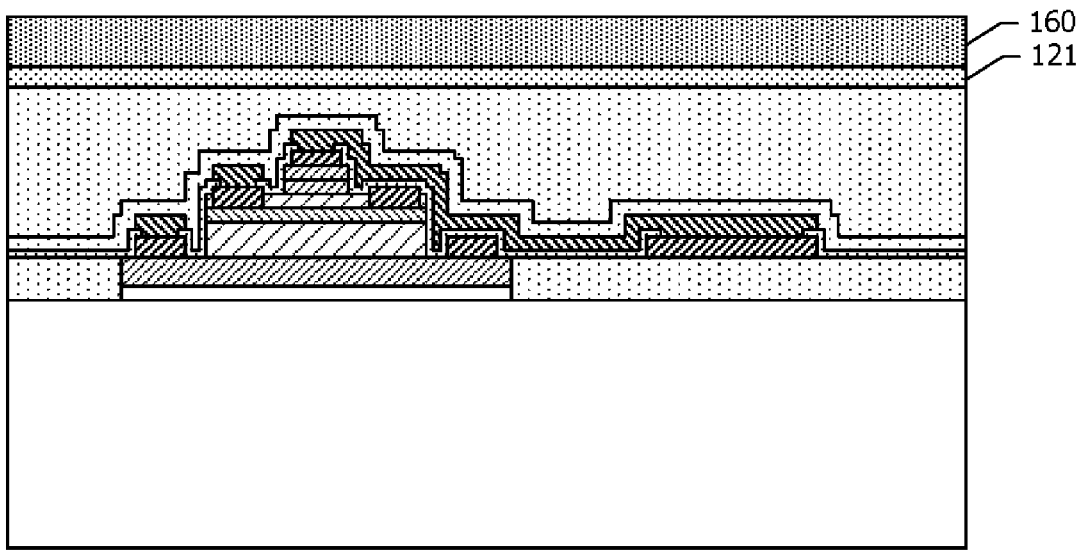
FIGS. 20A and 20B are sectional views of a semiconductor device according to the third embodiment during its production.
Figure 20B:
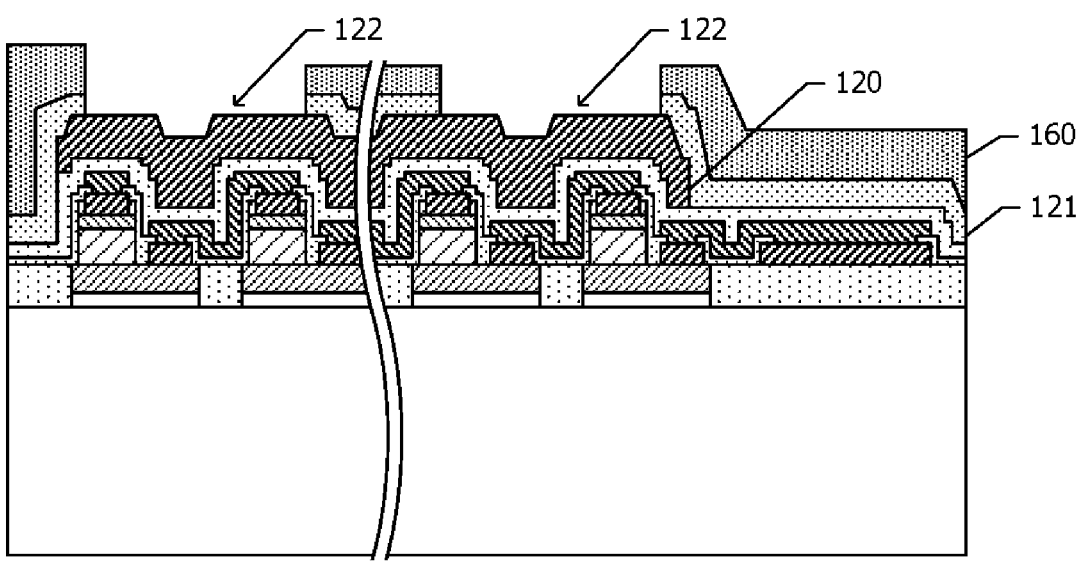

As illustrated in FIGS. 20A and 20B, the protective film 121 is etched by using the resist film 160 as an etching mask to form openings 122 in the protective film 121. The first metal film 120 is exposed inside the openings 122. For example, dry etching can be used for etching the protective film 121. After the openings 122 are formed in the protective film 121, the resist film 160 is removed.

Figure 21A:
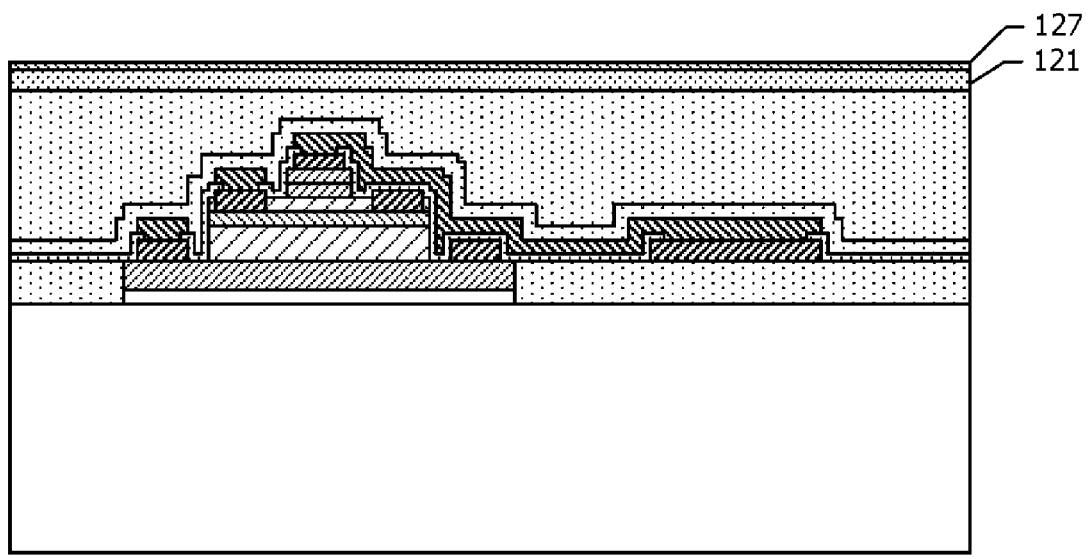
FIGS. 21A and 21B are sectional views of a semiconductor device according to the third embodiment during its production.
Figure 21B:
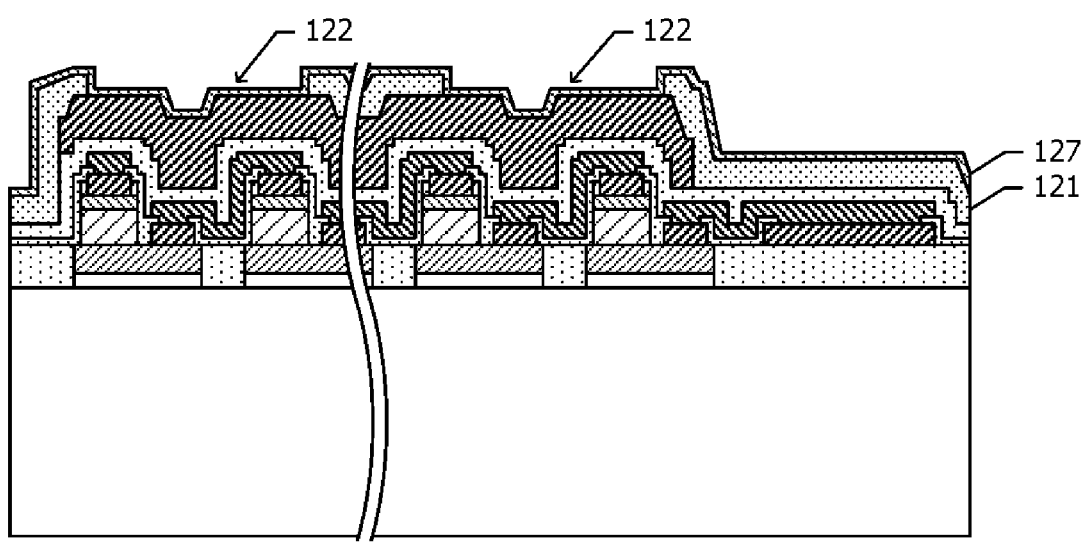

As illustrated in FIGS. 21A and 21B, a seed electrode layer 127 for plating is formed over the entire region of the substrate 40 so as to cover the upper surface of the protective film 121 and the side surfaces and bottom surfaces of the openings 122. The seed electrode layer 127 includes, for example, two layers of a TiW film having a thickness of 0.1 μm and a Cu film having a thickness of 0.1 μm. The seed electrode layer 127 can be formed by using, for example, a sputtering method.

Figure 22A:
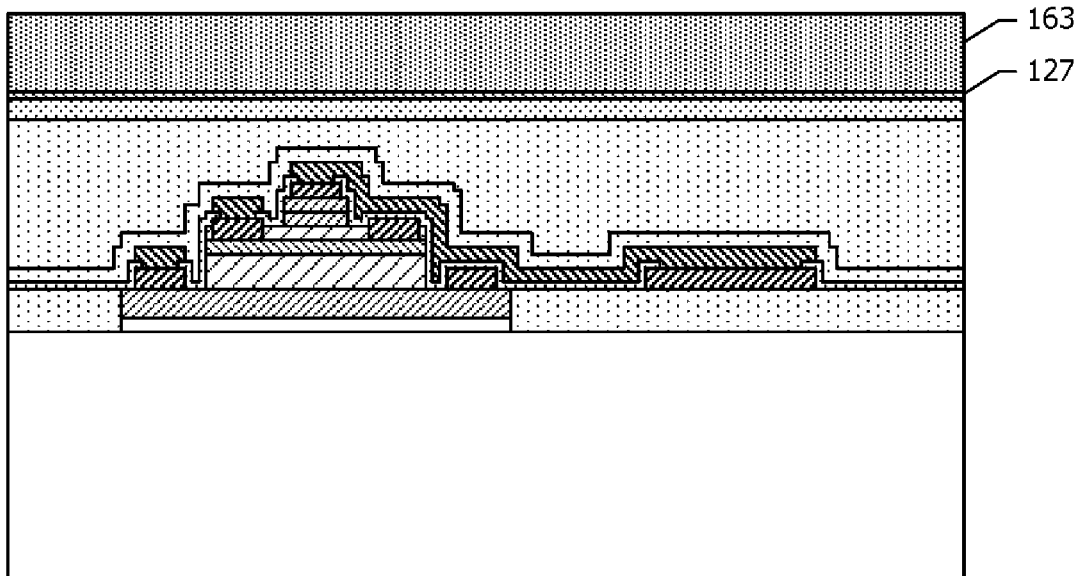
FIGS. 22A and 22B are sectional views of a semiconductor device according to the third embodiment during its production.
Figure 22B:
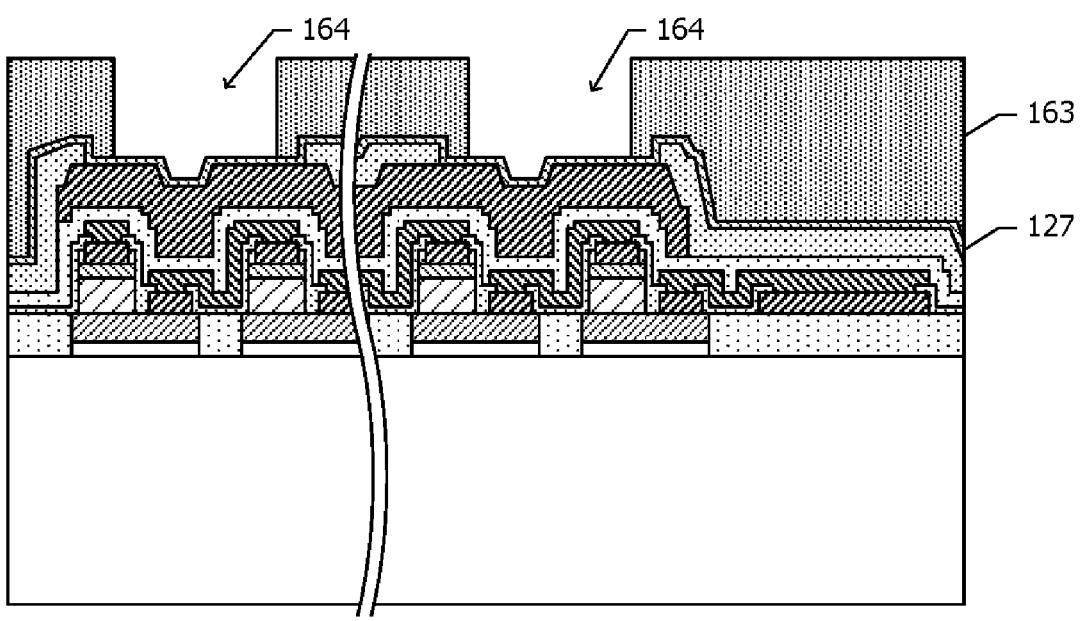

As illustrated in FIGS. 22A and 22B, a resist film 163 is formed on the seed electrode layer 127. Openings 164 are formed by photolithography in regions where a second metal film 130 and a third metal film 131 (FIG. 6) are to be formed. The seed electrode layer 127 is exposed in the openings 164.

Figure 23A:
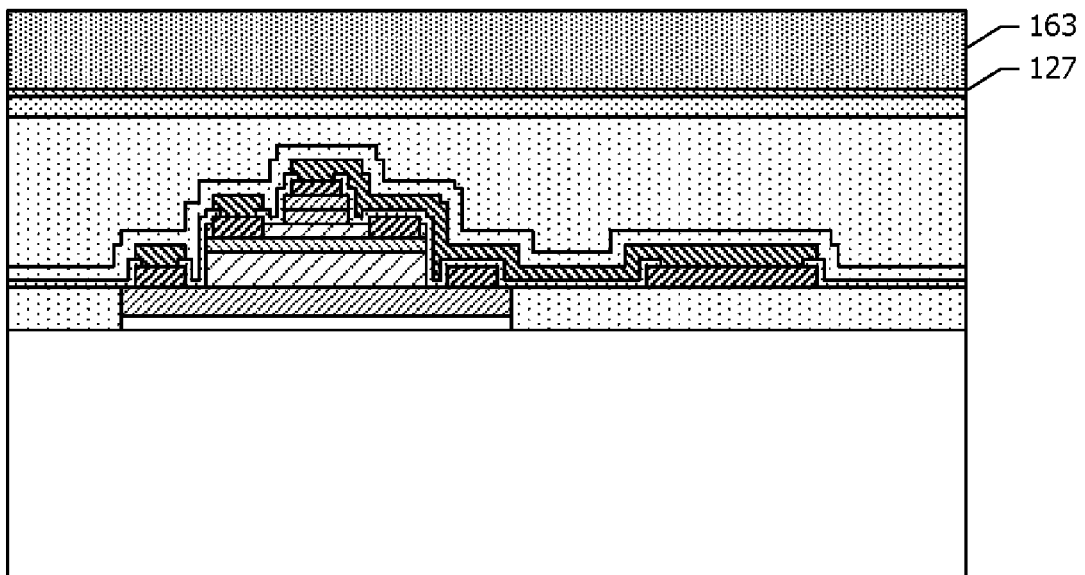
FIGS. 23A and 23B are sectional views of a semiconductor device according to the third embodiment during its production.
Figure 23B:
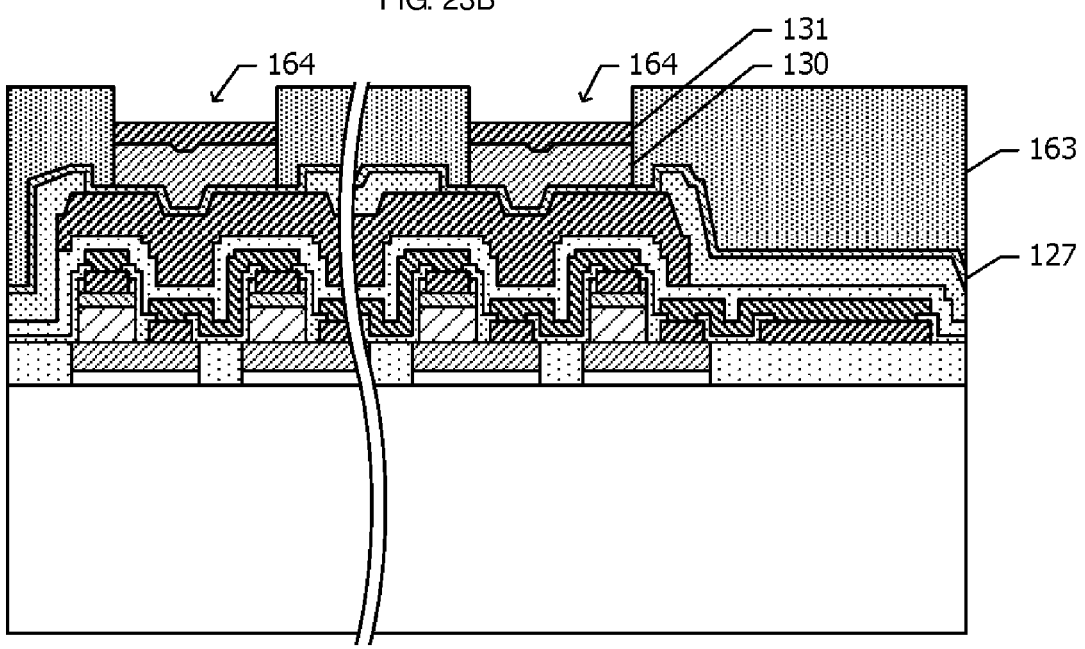

As illustrated in FIGS. 23A and 23B, the second metal film 130 and the third metal film 131 are sequentially deposited by electroplating on the seed electrode layer 127 in the openings 164. The second metal film 130 is formed of, for example, Cu and has a thickness of 2 μm. The third metal film 131 is formed of, for example, Au and has a thickness of 1 μm. The upper surface of the third metal film 131 is lower than the upper surface of the resist film 163. After the formation of the second metal film 130 and the third metal film 131, the resist film 163 is removed.

Figure 24A:
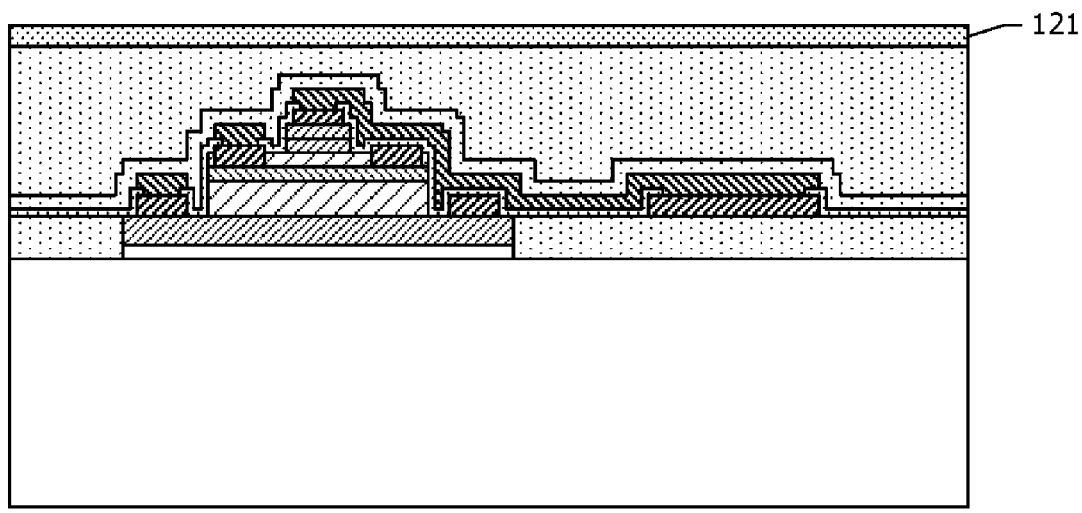
FIGS. 24A and 24B are sectional views of a semiconductor device according to the third embodiment during its production.
Figure 24B:
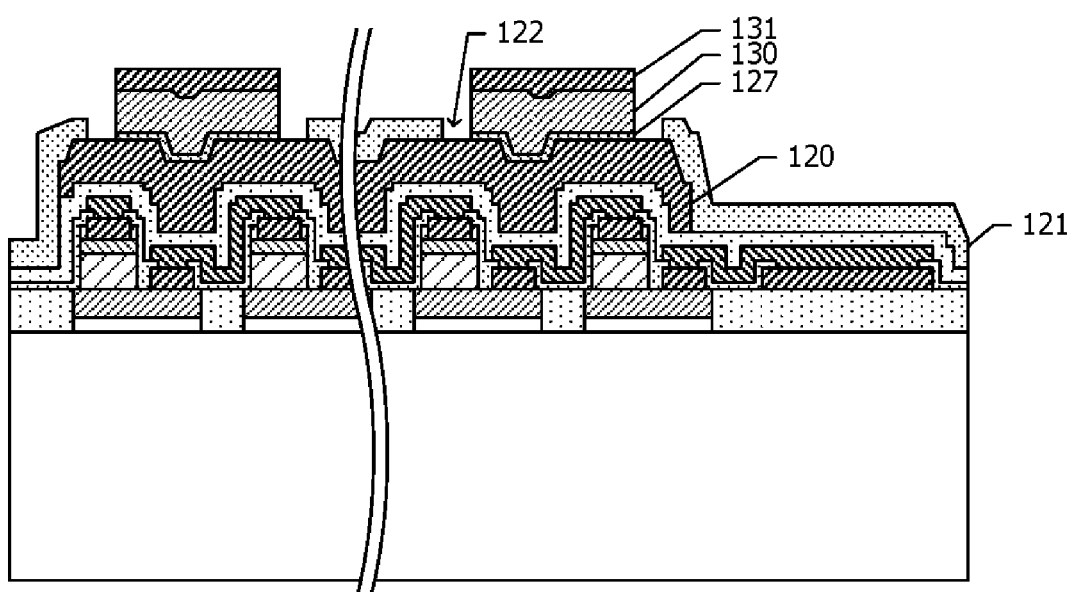

As illustrated in FIGS. 24A and 24B, the seed electrode layer 127 exposed in regions where the second metal film 130 is not formed is removed by etching. In the section illustrated in FIG. 24A, the protective film 121 is exposed. In the section illustrated in FIG. 24B, the protective film 121 and the first metal film 120 located in the openings 122 formed in the protective film 121 are exposed.

Figure 25A:
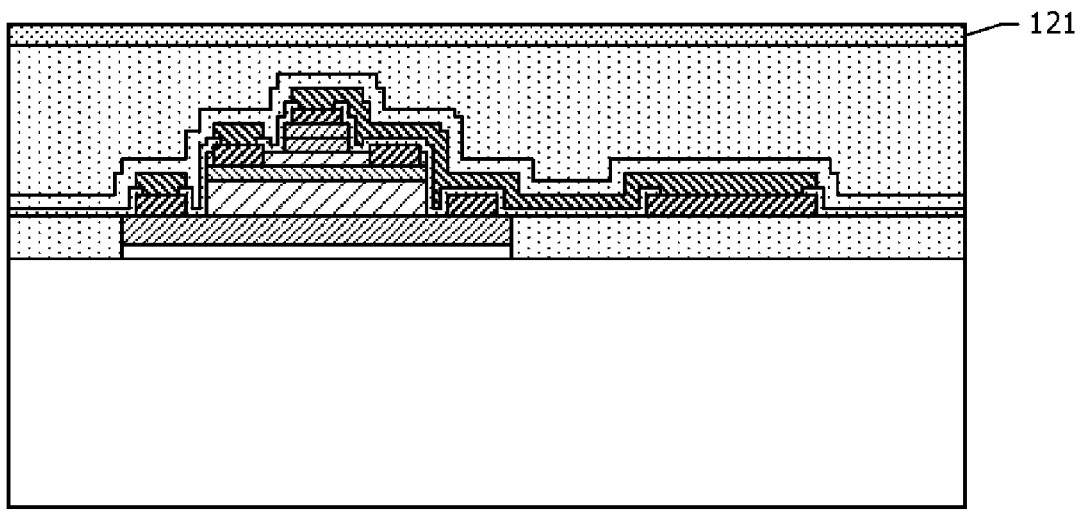
FIGS. 25A and 25B are sectional views of a semiconductor device according to the third embodiment during its production.
Figure 25B:
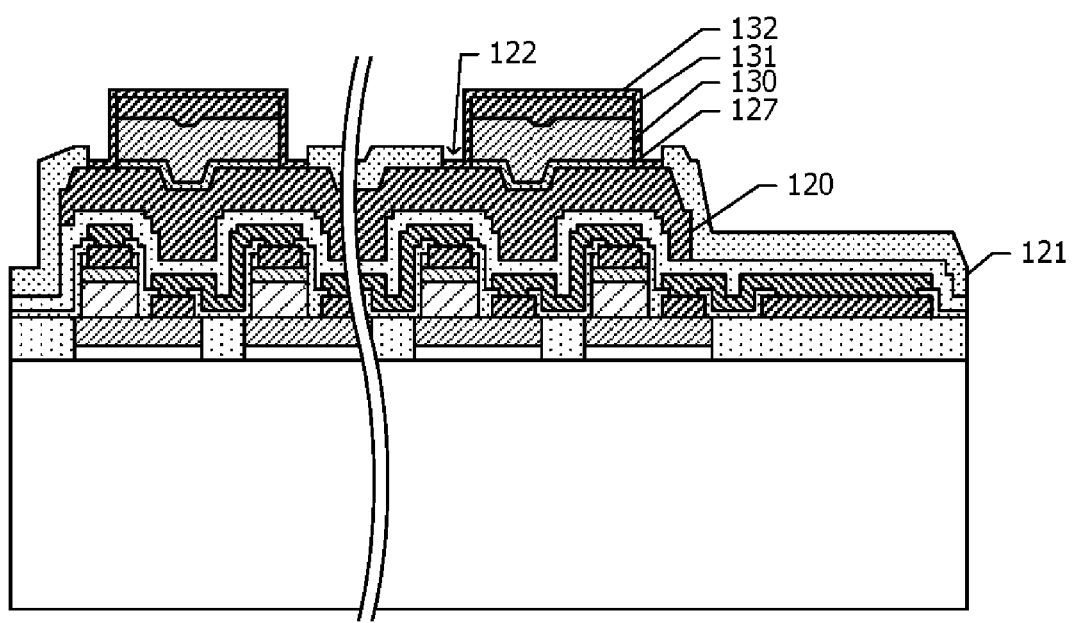

As illustrated in FIG. 25B, a fourth metal film 132 is formed on the side surfaces and the upper surface of a stacked structure including the seed electrode layer 127, the second metal film 130, and the third metal film 131, and the upper surface of the first metal film 120 exposed in the openings 122. The fourth metal film 132 can be formed by using, for example, electroless plating. The fourth metal film 132 is formed of, for example, Au and has a thickness of 0.1 μm. The Au is not deposited on the upper surface of the protective film 121 illustrated in FIGS. 25A and 25B.

Figure 26A:
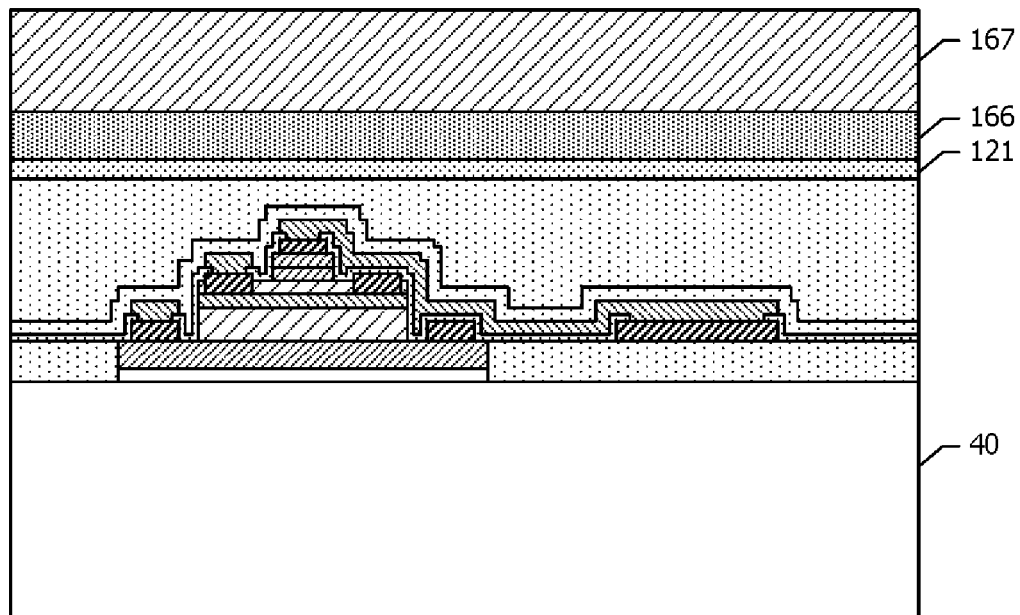
FIGS. 26A and 26B are sectional views of a semiconductor device according to the third embodiment during its production.
Figure 26B:
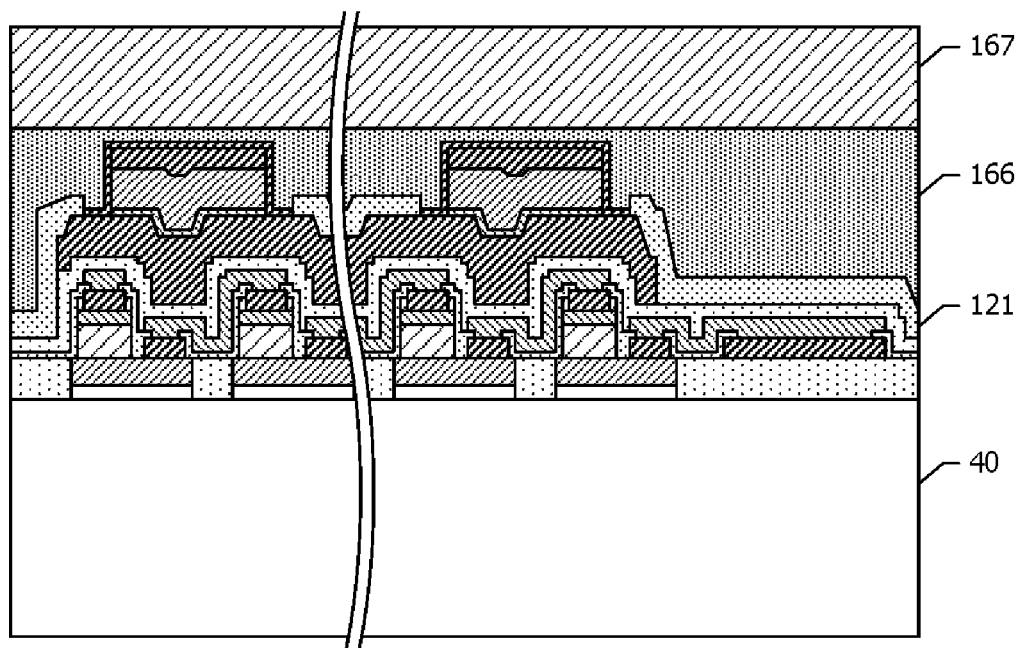

As illustrated in FIGS. 26A and 26B, a front surface of the substrate 40 (the surface on which the protective film 121 is formed) is disposed so as to face a sapphire substrate 167, and the substrate 40 is attached to the sapphire substrate 167 with wax 166 therebetween.

Figure 27A:
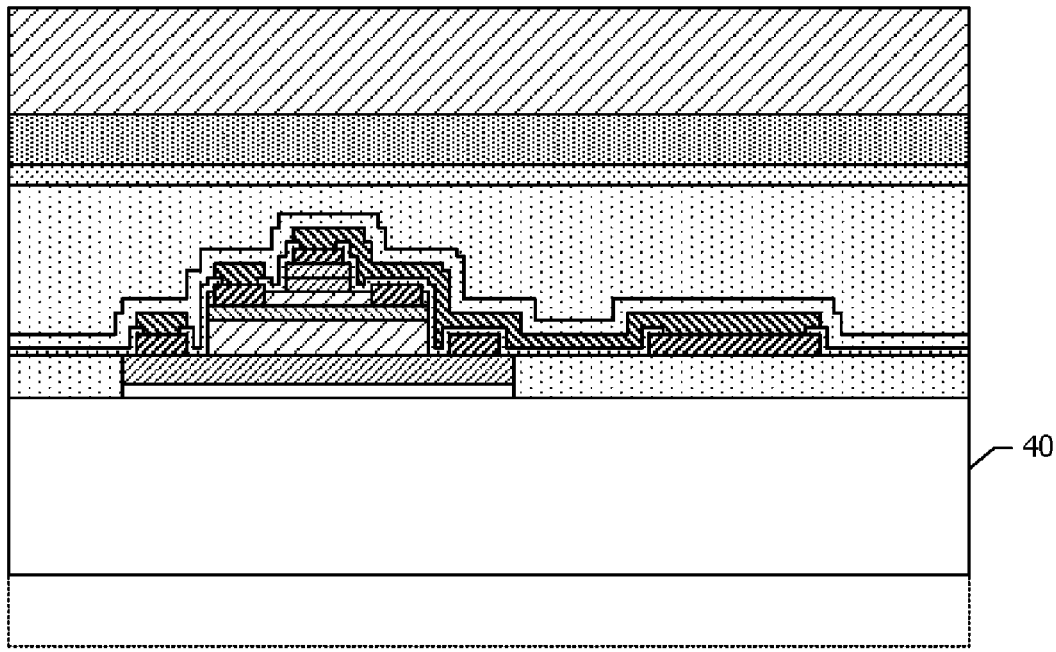
FIGS. 27A and 27B are sectional views of a semiconductor device according to the third embodiment during its production.
Figure 27B:
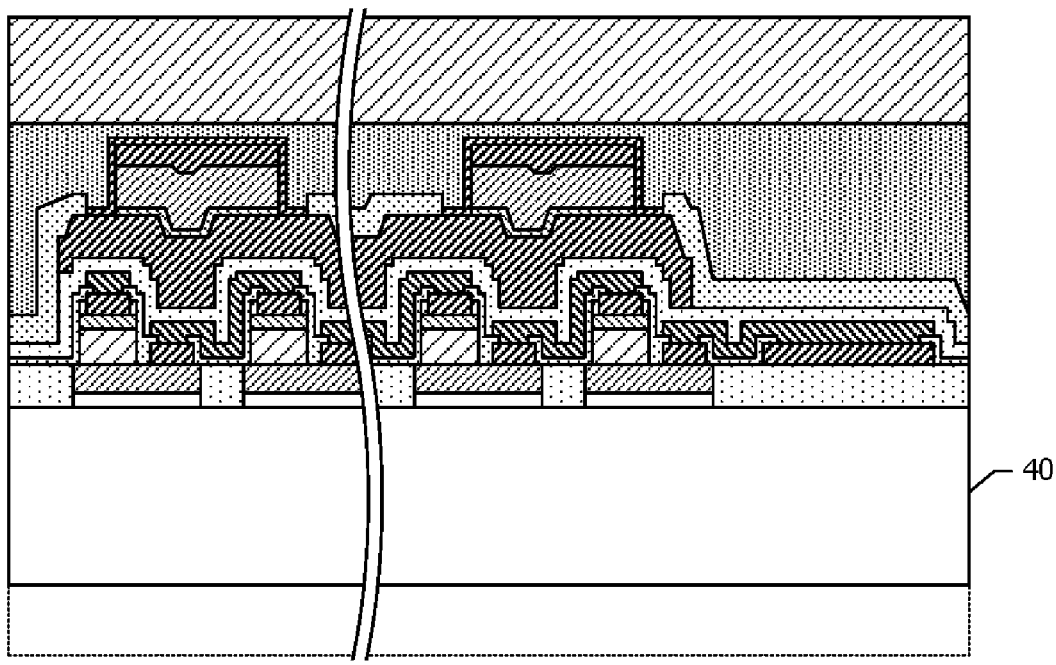

As illustrated in FIGS. 27A and 27B, the substrate 40 is ground from the backside thereof to thereby reduce the thickness to 75 μm.

Figure 28A:
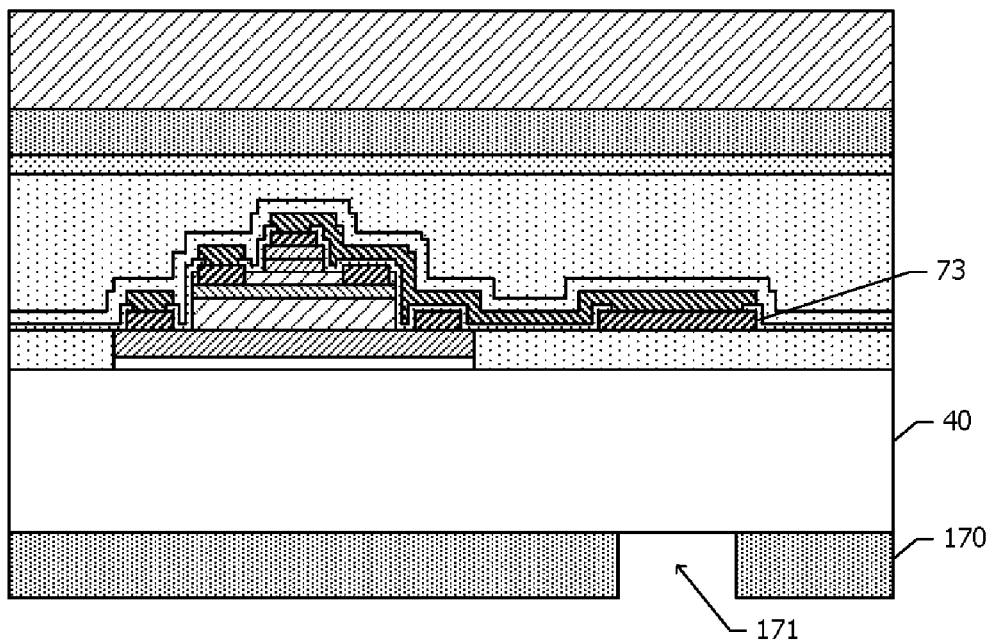
FIGS. 28A and 28B are sectional views of a semiconductor device according to the third embodiment during its production.
Figure 28B:
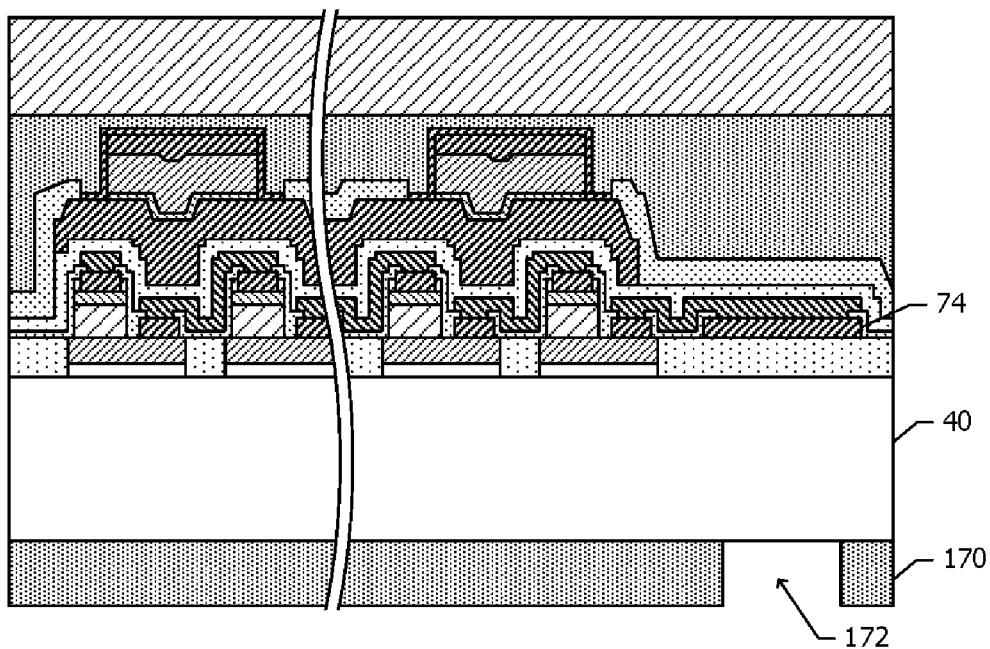

As illustrated in FIGS. 28A and 28B, a resist film 170 is formed on a back surface of the substrate 40 having the reduced thickness. Openings 171 and 172 are formed in the resist film 170 by photolithography. The openings 171 and 172 are formed at positions corresponding to the via-hole connecting pads 73 and 74, respectively.

Figure 29A:
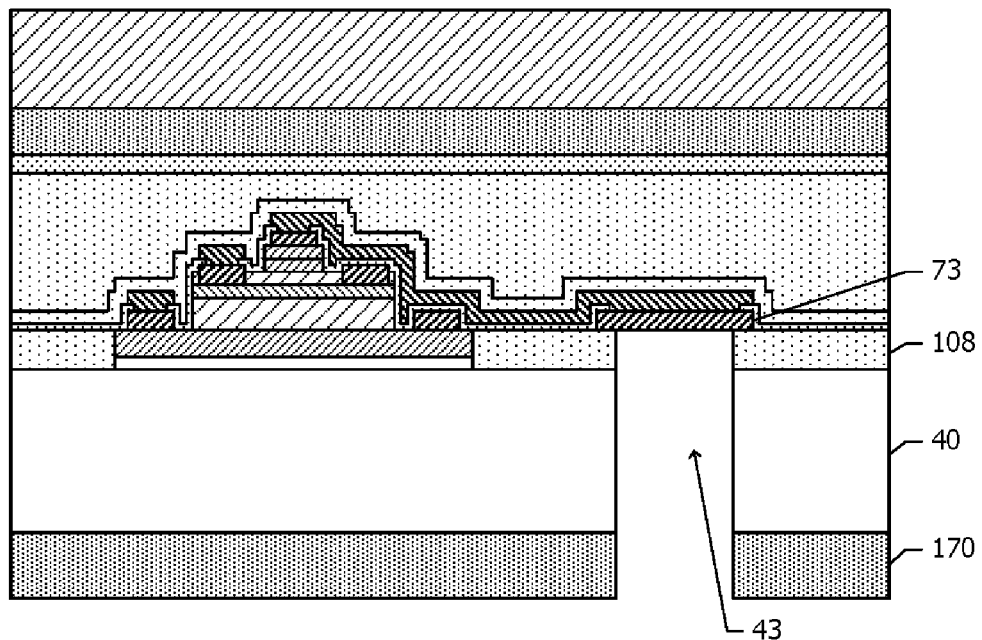
FIGS. 29A and 29B are sectional views of a semiconductor device according to the third embodiment during its production.
Figure 29B:
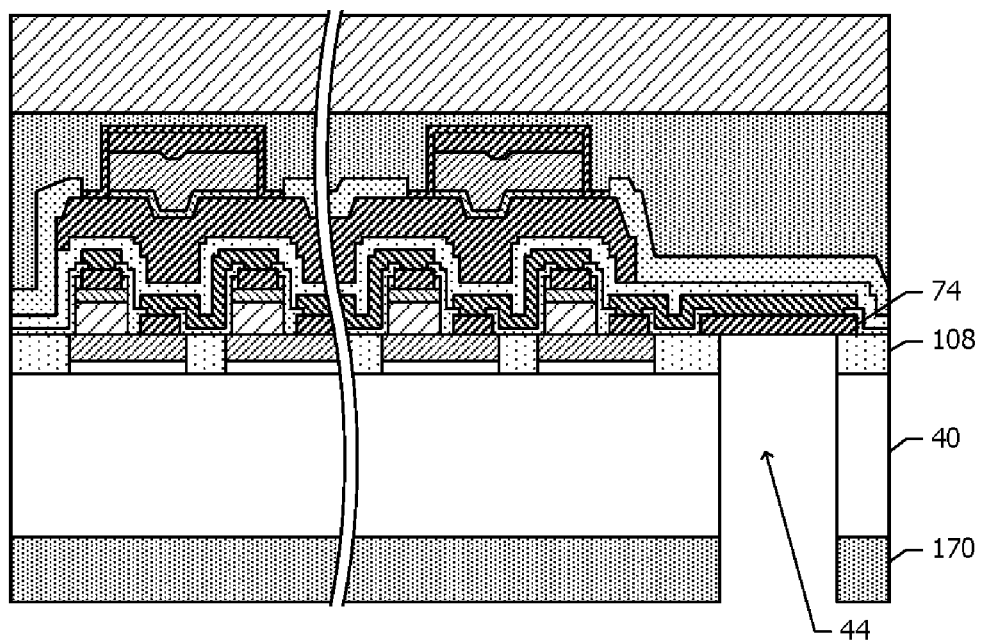

As illustrated in FIGS. 29A and 29B, the substrate 40 and the element isolation region 108 are etched by using the resist film 170 as an etching mask. As a result, via-holes 43 and 44 penetrating through the substrate 40 and the element isolation region 108 are formed, and the via-hole connecting pads 73 and 74 are respectively exposed on the bottom surfaces thereof. Anisotropic dry etching can be used for etching the substrate 40 and the element isolation region 108. After the exposure of the via-hole connecting pads 73 and 74, the resist film 170 is removed.

Figure 30A:
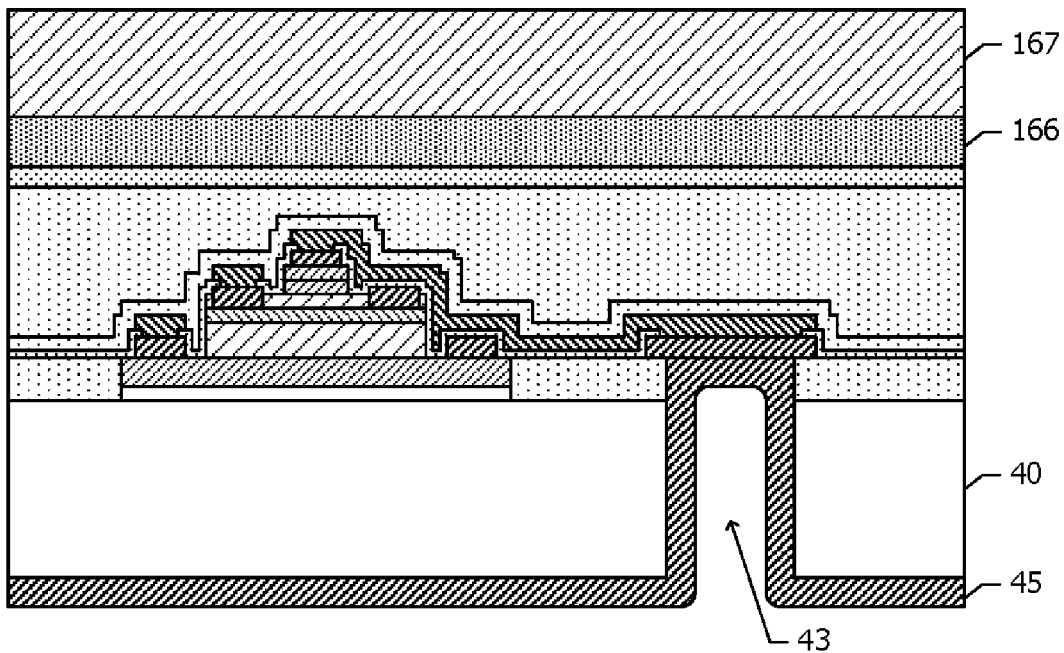
FIGS. 30A and 30B are sectional views of a semiconductor device according to the third embodiment during its production.
Figure 30B:
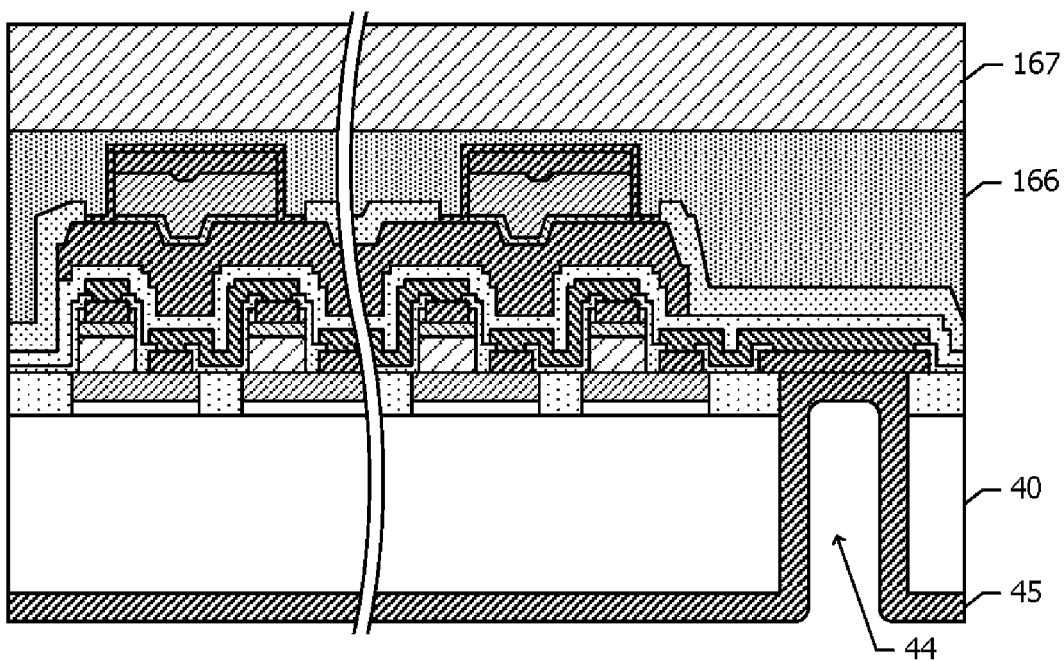

As illustrated in FIGS. 30A and 30B, a back-surface electrode 45 is formed on the back surface of the substrate 40, and the side surfaces and the bottom surfaces of the via-holes 43 and 44. The back-surface electrode 45 can be formed by depositing palladium by electroless plating and then depositing Au by electroplating. The back-surface electrode 45 has a thickness of 4 μm. After the formation of the back-surface electrode 45, the wax 166 and the sapphire substrate 167 are removed from the substrate 40.

Figure 31A:
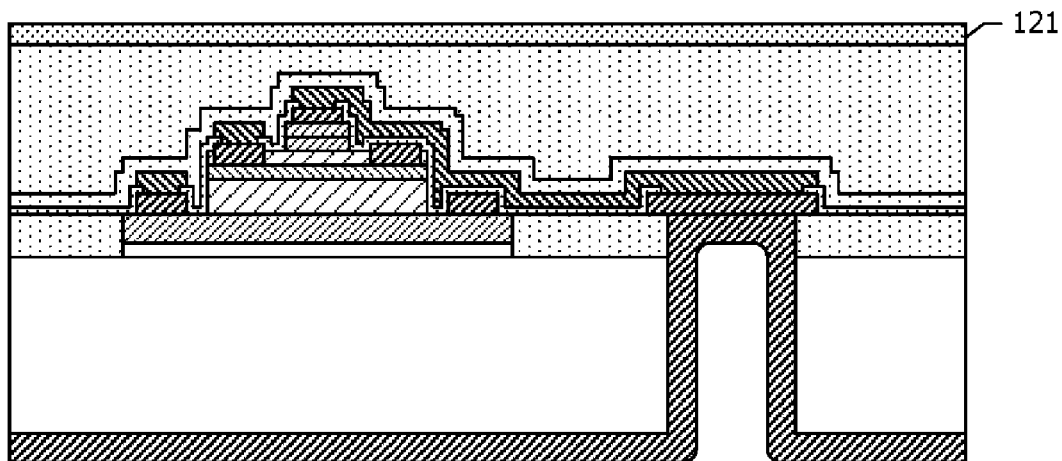
FIGS. 31A and 31B are sectional views of a semiconductor device according to the third embodiment during its production.
Figure 31B:
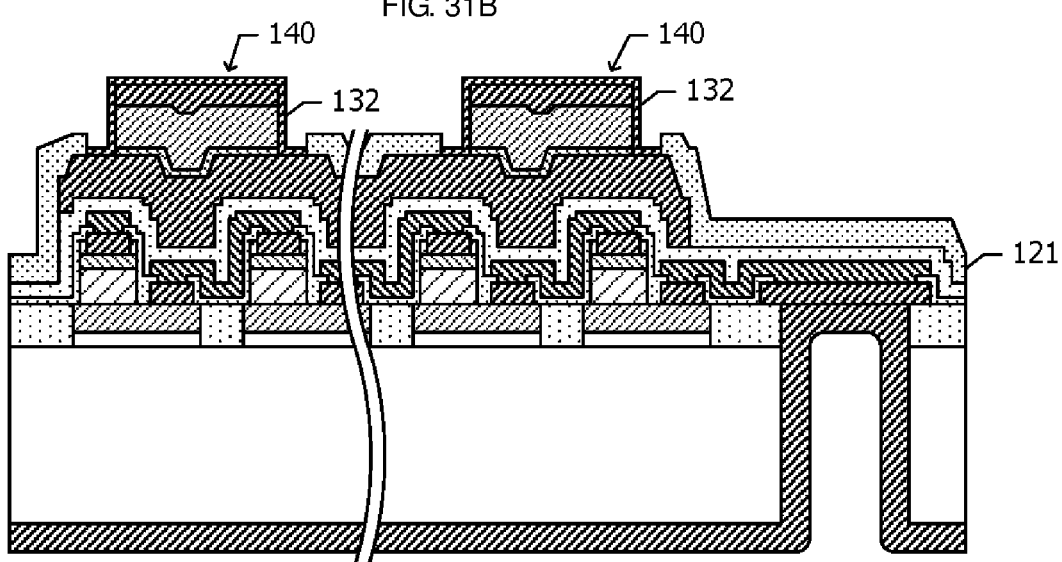

As illustrated in FIGS. 31A and 31B, the fourth metal film 132, which is the outermost layer of the bonding pads 140, and the protective film 121 are exposed. Subsequently, for example, dicing is performed so that the substrate 40 is divided into chips. Thus, the semiconductor device is completed.

Fourth Embodiment

Next, a semiconductor device according to a fourth embodiment will be described with reference to FIG. 32A. Hereinafter, a description of configurations common to the configurations of the first embodiment, which have been described with reference to FIGS. 1A to 4, is omitted.

Figure 32A:
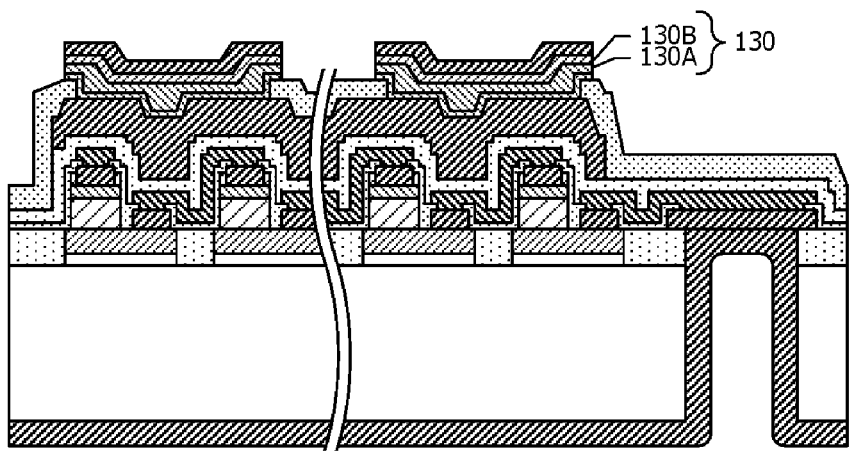
FIG. 32A is a sectional view of a semiconductor device according to a fourth embodiment.

FIG. 32A is a sectional view of a semiconductor device according to the fourth embodiment. In the first embodiment, the second metal film 130 (FIG. 1C) that forms the bonding pads 140 is constituted by a single layer made of a metal material harder than the first metal film 120. In the fourth embodiment, the second metal film 130 has a two-layer structure including a lower metal film 130A and an upper metal film 130B that are made of different metal materials. The lower metal film 130A and the upper metal film 130B are formed of metal materials harder than the first metal film 120. For example, two metals selected from three metals of Cu, Ni, and Mo are preferably used as the lower metal film 130A and the upper metal film 130B.

Next, semiconductor devices according to modifications of the fourth embodiment will be described with reference to FIGS. 32B and 32C.

Figure 32B:
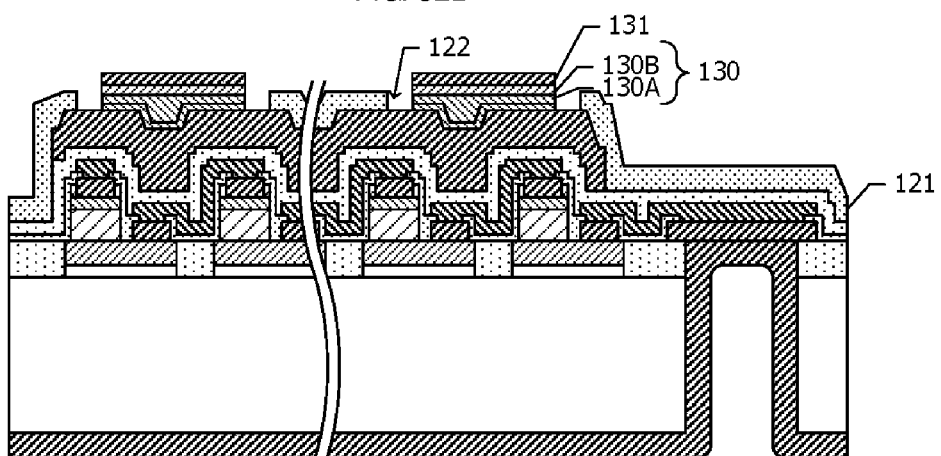
FIGS. 32B and 32C are sectional views of semiconductor devices according to modifications of the fourth embodiment.
Figure 32C:
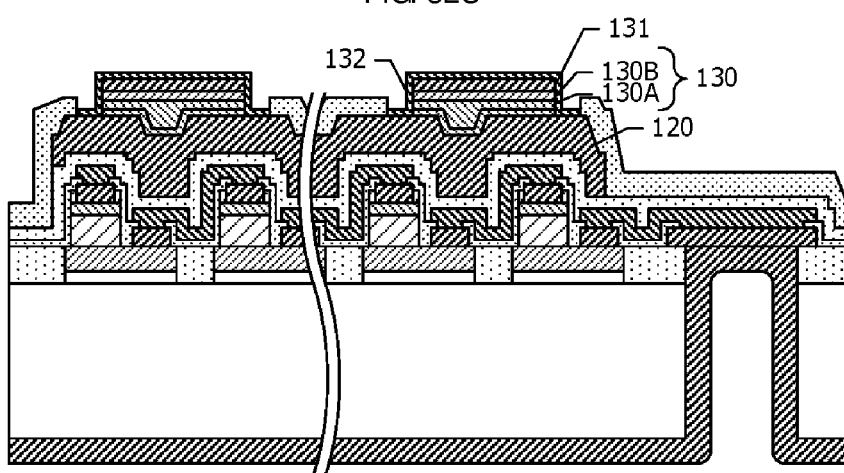

FIGS. 32B and 32C are each a sectional view of a semiconductor device according to a modification of the fourth embodiment. In the modification illustrated in FIG. 32B, a second metal film 130 and a third metal film 131 are disposed inside an opening 122 provided in a protective film 121, as in the bonding pad 140 (FIG. 5) of the semiconductor device according to the second embodiment. In the modification illustrated in FIG. 32C, a stacked structure including a second metal film 130 and a third metal film 131, and an upper surface of the first metal film 120 located on the periphery of the stacked structure are covered with a fourth metal film 132, as in the bonding pad 140 (FIG. 6) of the semiconductor device according to the third embodiment. Also in the modifications illustrated in FIGS. 32B and 32C, the second metal film 130 includes two layers of a lower metal film 130A and an upper metal film 130B.

In the fourth embodiment and the modifications of the fourth embodiment, a plurality of materials can be combined such that the second metal film 130 has desired hardness as a whole, and an increase in the electrical resistivity is suppressed. As a result, semiconductor devices having higher reliability are provided.

Fifth Embodiment

Next, a semiconductor device according to a fifth embodiment will be described with reference to FIGS. 33A to 34C. Hereinafter, a description of configurations common to the configurations of the first embodiment to the fourth embodiment is omitted. In the first embodiment to the fourth embodiment, the indices of crystal plane of the upper surface of the substrate 40 (FIGS. 1B, 1C, etc.), and the planar shape and the crystal orientation of a pattern of each semiconductor layer of the diodes 47 (FIG. 1C, etc.) are not limited. In the fifth embodiment, the indices of crystal plane of the upper surface of the substrate 40 are specified, and planar shapes and preferred crystal orientations of patterns of semiconductor layers are limited.

First, anisotropic etching characteristics due to wet etching will be described with reference to FIGS. 33A to 33E.

FIG. 33A is a plan view of a regular octagonal mesa formed, by anisotropic etching, on a GaAs substrate having a (100) plane as an upper surface. One side of the regular octagon is parallel to the [011] direction. FIGS. 33B, 33C, 33D, and 33E are sectional views taken along dash-dotted lines 33B-33B, 33C-33C, 33D-33D, and 33E-33E of FIG. 33A, respectively. A weakly acidic or weakly alkaline etchant can be used as an etchant for performing the anisotropic etching.

In the section illustrated in FIG. 33B, an inverted mesa portion is easily formed in which the (111)A plane appears on a side surface oriented in the [01-1] direction and a side surface oriented in the opposite direction thereof. For example, an upper layer portion of a mesa structure has an inverted mesa shape, and a lower layer portion thereof has a normal mesa shape. An eave-shaped portion protruding in a lateral direction is formed on the inverted mesa portion. Herein, the minus sign attached to an element of the Miller indices denotes that an overbar is attached to the element. In the section illustrated in FIG. 33C, the (111)B plane easily appears on a side surface oriented in the [0-1-1] direction and a side surface oriented in the opposite direction thereof, and the side surfaces form gently inclined surfaces. The section illustrated in FIG. 33D forms a shape in which a side surface oriented in the [00-1] direction and a side surface oriented in the opposite direction thereof rise substantially perpendicularly. The section illustrated in FIG. 33E forms a shape in which a side surface oriented in the [0-10] direction and a side surface oriented in the opposite direction thereof rise substantially perpendicularly.

Anisotropic etching characteristics illustrated in each of FIGS. 33B to 33E are the same as the characteristics when a compound semiconductor that is epitaxially grown on a GaAs substrate having a (100) plane as an upper surface is subjected to anisotropic etching. Similar characteristics are obtained, besides the case of a GaAs substrate, also in the case where a compound semiconductor substrate having a zincblend crystal structure and a compound semiconductor layer that is epitaxially grown on the substrate are subjected to anisotropic etching.

Figure 34A:
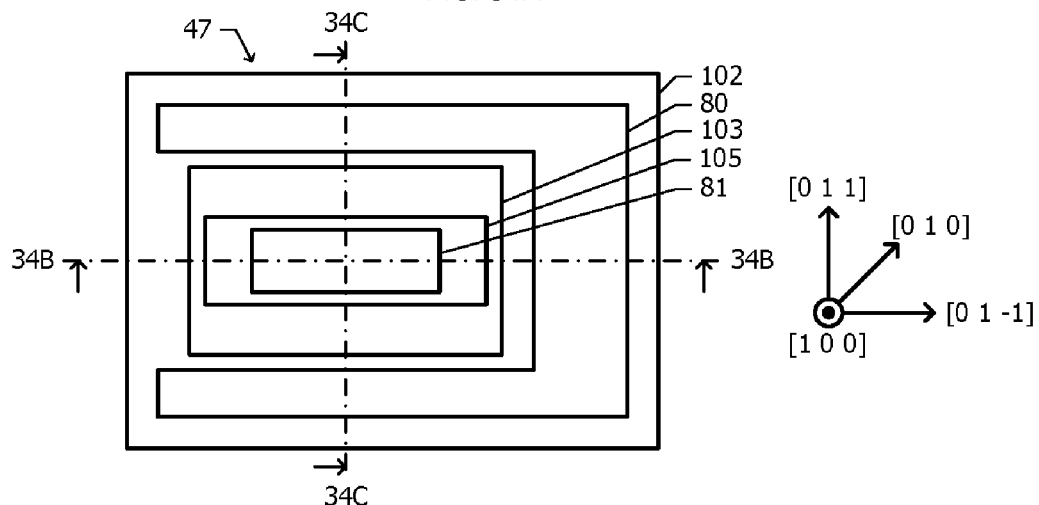
FIG. 34A is a plan view of one diode of a semiconductor device according to a fifth embodiment.
Figure 34B:
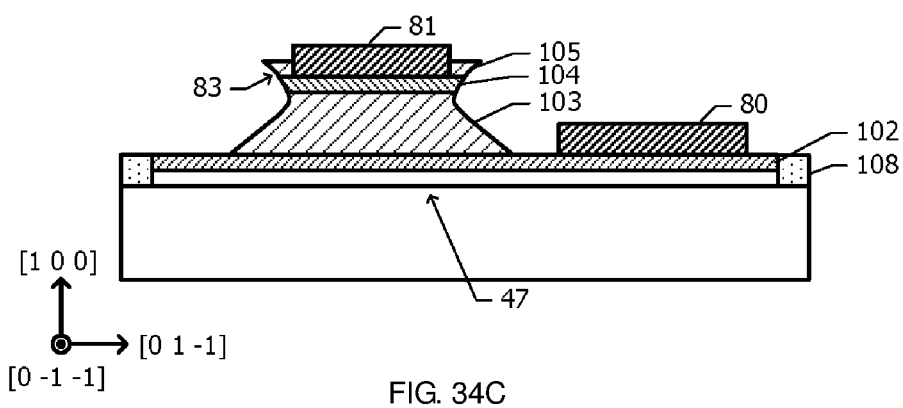
FIGS. 34B and 34C are sectional views taken along dash-dotted lines 34B-34B and 34C-34C of FIG. 34A, respectively.
Figure 34C:
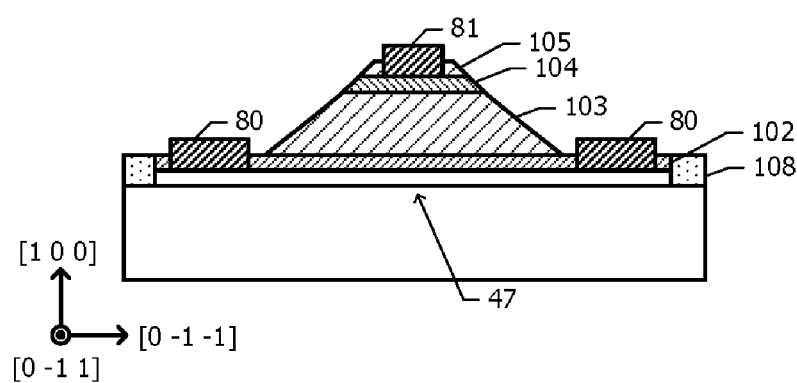

FIG. 34A is a plan view of one diode 47 of a semiconductor device according to the fifth embodiment. FIGS. 34B and 34C are sectional views taken along dash-dotted lines 34B-34B and 34C-34C of FIG. 34A, respectively. A substrate 40 has an upper surface having indices of crystal plane of (100). The substrate 40 may be a substrate having an upper surface that is a crystal plane having an off-angle of 4° or less from a (100) plane.

A collector layer 103, a base layer 104, and an emitter layer 105 are stacked on a sub-collector layer 102 surrounded by an element isolation region 108. In plan view, the emitter layer 105 is disposed inside the collector layer 103. A cathode electrode 80 formed on the sub-collector layer 102 surrounds the collector layer 103 from three directions of the [011] direction, the [0-11] direction, and the [0-1-1] direction. An anode electrode 81 formed on the emitter layer 105 penetrates through the emitter layer 105 and is ohmically connected to the base layer 104.

A plurality of diodes 47 (FIG. 1C) are arranged in parallel in the [01-1] direction. This arrangement direction corresponds to an easy direction of cleavage of the substrate 40 made of GaAs. In other words, the diodes 47 are arranged in a direction parallel to the easy direction of cleavage.

The emitter layer 105, the base layer 104, and the collector layer 103 are patterned by performing anisotropic etching using the same etching mask (refer to FIGS. 11B and 12B). The etching mask has a rectangular planar shape and has a long side parallel to the [01-1] direction and a short side parallel to the [011] direction.

As illustrated in FIG. 34B, in a section perpendicular to the [0-1-1] direction, an upper layer portion of a mesa including the collector layer 103, the base layer 104, and the emitter layer 105 has an inverted mesa shape to form eave-shaped portions 83. The emitter layer 105 illustrated in FIG. 34A corresponds to an outer peripheral line of the upper surface thereof.

As illustrated in FIG. 34C, in a section perpendicular to the [0-11] direction, the mesa including the collector layer 103, the base layer 104, and the emitter layer 105 has a normal mesa shape to form gently inclined surfaces. The collector layer 103 illustrated in FIG. 34A illustrates an outer peripheral line of the bottom surface thereof.

Next, a significantly advantageous effect of the fifth embodiment will be described. During bonding, a load applied to the diodes 47 easily causes breakage in the eave-shaped portions 83. In the fifth embodiment, in the outer peripheral line of the emitter layer 105 (FIG. 34A), the sides which are parallel to the [011] direction and on which the eave-shaped portions 83 are formed are shorter than the sides which are parallel to the [01-1] direction and on which the gently inclined surfaces are formed. Thus, regions where the eave-shaped portions 83 are formed are limited to a narrow range. Accordingly, breakage due to a load during bonding is unlikely to occur.

FIGS. 34A to 34C illustrate an example in which the anode electrode 81 penetrates through the emitter layer 105 and is ohmically connected to the base layer 104. Alternatively, the emitter layer 105 may be removed, and the anode electrode 81 may be directly formed on the base layer 104. In this case, an upper layer portion of the base layer 104 and collector layer 103 form the eave-shaped portions 83.

To enhance the effect of suppressing breakage of the eave-shaped portions 83, on the upper surface of the mesa portion having the anode electrode 81 thereon, the length of the short side is preferably ½ or less of the length of the long side.

Sixth Embodiment

Next, a semiconductor device according to a sixth embodiment will be described with reference to FIGS. 35A to 35C. Hereinafter, a description of configurations common to the configurations of the semiconductor device according to the fifth embodiment is omitted.

Figure 35A:
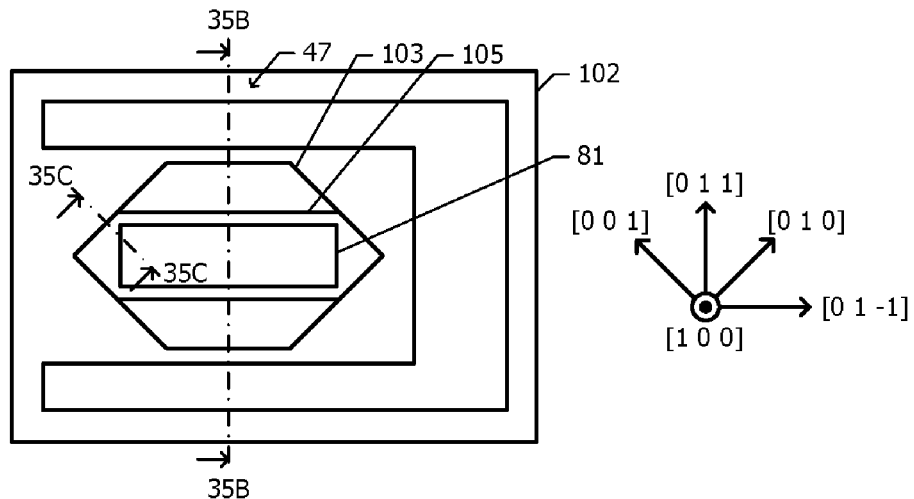
FIG. 35A is a plan view of one diode of a semiconductor device according to a sixth embodiment.

FIG. 35A is a plan view of one diode 47 of a semiconductor device according to the sixth embodiment. FIGS. 35B and 35C are sectional views taken along dash-dotted lines 35B-35B and 35C-35C of FIG. 35A, respectively. In the fifth embodiment, the emitter layer 105 and the collector layer 103 (FIG. 34A) each have a rectangular planar shape. In the sixth embodiment, planar shapes of an emitter layer 105 and a collector layer 103 are each a polygon including sides parallel to the [01-1] direction, sides parallel to the [001] direction, and sides parallel to the [010] direction, for example, a parallel hexagon.

Figure 35B:
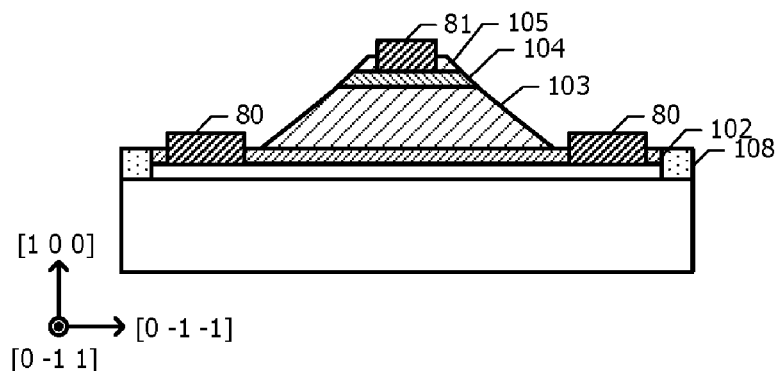
FIGS. 35B and 35C are sectional views taken along dash-dotted lines 35B-35B and 35C-35C of FIG. 35A, respectively.

As illustrated in FIG. 35B, in a section that perpendicularly intersects a side parallel to the [01-1] direction, a mesa including a collector layer 103, a base layer 104, and an emitter layer 105 has a normal mesa shape as in the section illustrated in FIG. 34C of the fifth embodiment. As illustrated in FIG. 35A, the bottom surface of the collector layer 103 extends in the [011] direction and the [0-1-1] direction with respect to the bottom surface of the emitter layer 105.

Figure 35C:
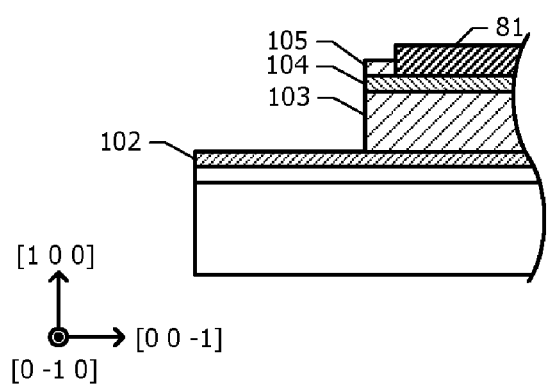

As illustrated in FIG. 35C, a section that intersects a side parallel to the [010] direction forms a shape in which a side surface of the mesa including the collector layer 103, the base layer 104, and the emitter layer 105 rises perpendicularly. Similarly, a section that intersects a side parallel to the [001] direction also forms such a shape.

In the sixth embodiment, the mesa including the collector layer 103, the base layer 104, and the emitter layer 105 of the diode 47 has no eave-shaped portions. This structure provides the advantageous effect that breakage due to a load during bonding is unlikely to occur.

Seventh Embodiment

Next, a semiconductor device according to a seventh embodiment will be described with reference to FIGS. 36A and 36B. Hereinafter, a description of configurations common to the configurations of the semiconductor device according to the sixth embodiment is omitted.

Figure 36A:
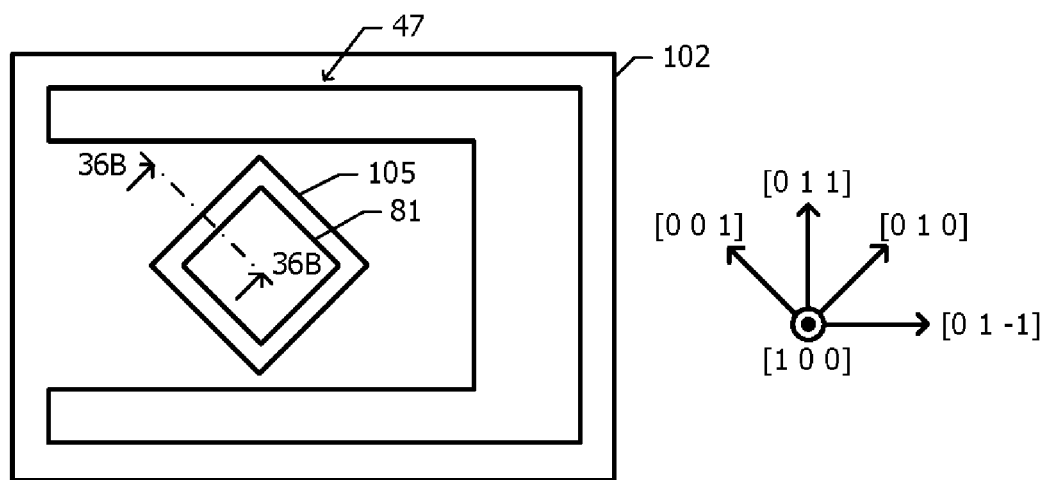
FIG. 36A is a plan view of one diode of a semiconductor device according to a seventh embodiment.

FIG. 36A is a plan view of one diode 47 of a semiconductor device according to the seventh embodiment. In the sixth embodiment, the emitter layer 105 has a parallel hexagonal planar shape (FIG. 35A). In the seventh embodiment, an emitter layer 105 has a square planar shape including sides parallel to the [010] direction and sides parallel to the direction.

Figure 36B:
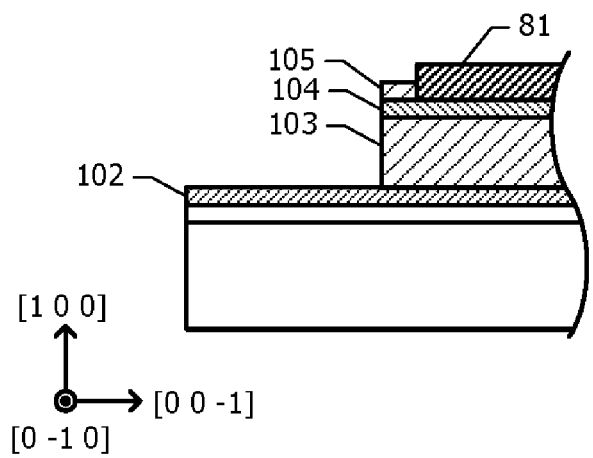
FIG. 36B is a sectional view taken along dash-dotted line 36B-36B of FIG. 36A.

FIG. 36B is a sectional view taken along dash-dotted line 36B-36B of FIG. 36A. A section that intersects a side parallel to the [010] direction has a shape in which a side surface of a mesa including a collector layer 103, a base layer 104, and an emitter layer 105 rises perpendicularly. Similarly, a section that intersects a side parallel to the direction also forms such a shape.

As described above, in the seventh embodiment, all of the side surfaces of the mesa that includes the collector layer 103, the base layer 104, and the emitter layer 105 rise perpendicularly, and no eave-shaped portions are formed. This structure provides the advantageous effect that breakage due to a load during bonding is unlikely to occur.

Eighth Embodiment

A power amplifier module according to an eighth embodiment will be described with reference to FIG. 37. This power amplifier module includes the semiconductor device according to any of the first embodiment to the seventh embodiment.

Figure 37:
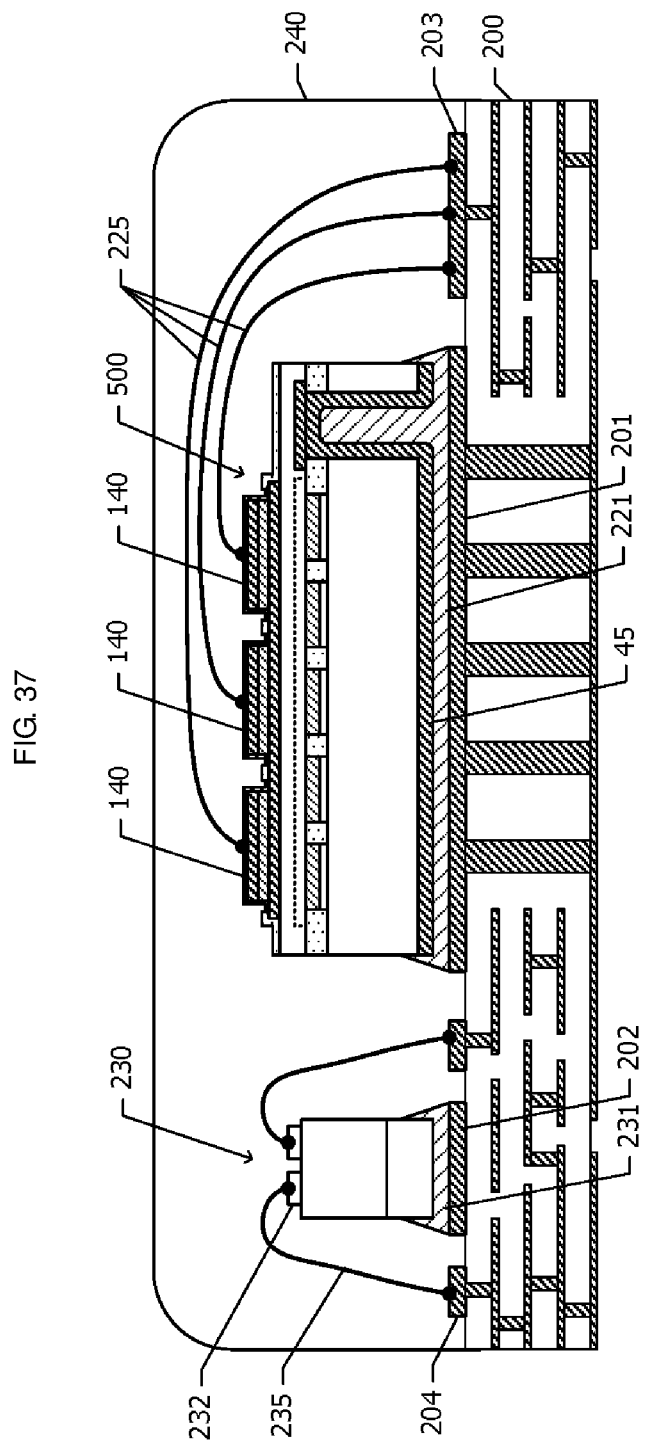
FIG. 37 is a sectional view of a power amplifier module according to an eighth embodiment.

FIG. 37 is a sectional view of a power amplifier module according to the eighth embodiment. A semiconductor device 500, a silicon semiconductor chip 230, and a plurality of other surface mount elements are mounted on a printed circuit board 200. The semiconductor device according to any of the first embodiment to the seventh embodiment is used as the semiconductor device 500. The silicon semiconductor chip 230 includes, for example, a CMOS circuit formed therein.

A back-surface electrode 45 of the semiconductor device 500 is fixed and electrically connected to a die pad 201 of the printed circuit board 200 with a conductive adhesive 221 therebetween. The silicon semiconductor chip 230 is fixed to a die pad 202 of the printed circuit board 200 with a conductive adhesive 231 therebetween. A Au film is formed on the outermost surface of each of the die pads 201 and 202. For example, an adhesive containing, as a main component, an epoxy resin in which silver (Ag) fine particles are dispersed can be used as the conductive adhesives 221 and 231. Besides an epoxy resin, an acrylic resin, a bismaleimide resin, a butadiene resin, a silicone resin, or a resin mixture prepared by mixing these resins may be used.

A plurality of bonding pads 140 of the semiconductor device 500 are connected to a bonding pad 203 of the printed circuit board 200 with a plurality of bonding wires 225 therebetween. For example, a Au wire having a diameter of 20 μm can be used as the bonding wires 225. The bonding wires 225 are bonded to the bonding pads 140 and 203 by using a wire bonder.

A plurality of bonding pads 232 of the silicon semiconductor chip 230 are connected to a plurality of bonding pads 204 of the printed circuit board 200 with a plurality of bonding wires 235 therebetween. The semiconductor device 500, the silicon semiconductor chip 230, the other surface mount elements, and the bonding wires 225 and 235 are sealed with a sealing cured resin 240.

In the eighth embodiment, since the semiconductor device according to any of the first embodiment to the seventh embodiment is used as the semiconductor device 500, miniaturization of the semiconductor device 500 can be realized. Furthermore, damage of the semiconductor device 500 during bonding can be suppressed. Accordingly, a highly reliable power amplifier module is provided.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a circuit element on a substrate made of a compound semiconductor;
    bonding pads disposed over the circuit element so as to at least partially overlap the circuit element; and
    a protective film disposed over the circuit element,
    wherein
    each of the bonding pads includes a first metal film, a second metal film on the first metal film and an opening in the protective film, the protective film being disposed on the first metal film, and the opening being inside the first metal film in plan view,
    a metal material of the second metal film has a higher Young's modulus than a metal material of the first metal film, and
    a wider first metal film is configured as a connection of each of the first metal film included in the bonding pads, and a plurality of the opening are disposed along the wider first metal film.

2. The semiconductor device according to claim 1, wherein:
    a thickness of the second metal film is equal to or larger than a thickness of the first metal film.

3. The semiconductor device according to claim 1, wherein:
    the first metal film and the second metal film included in at least two of the bonding pads are connected electrically.

4. The semiconductor device according to claim 1, further comprising:
    a seed electrode layer between the first metal film and the second metal film.

5. The semiconductor device according to claim 1, wherein:
    each of the bonding pads further includes a third metal film,
    the second metal film and the third metal film are disposed inside each of the plurality of the opening in plan view.

6. The semiconductor device according to claim 5, wherein:
    each of the bonding pads further includes a fourth metal film that is of a same metal material as the first metal film, and
    a portion of the fourth metal film covers a region of an upper surface of the first metal film inside the opening, the region not being covered with the second metal film, a side surface of the second metal film, and a side surface and an upper surface of the third metal film.

7. The semiconductor device according to claim 1, wherein:
    each of the bonding pads further includes a third metal film on the second film, and
    the third film is of a same metal material as the first metal film.

8. The semiconductor device according to claim 1, wherein:
the second metal film includes two layers made of different metal materials.

9. The semiconductor device according to claim 1, wherein:
the circuit element is a diode.

10. The semiconductor device according to claim 9, wherein:
the first metal film includes gold and the second metal includes copper.

11. The semiconductor device according to claim 9, wherein:
the compound semiconductor of the substrate has a zinc blend crystal structure, and
the substrate has an upper surface having an off-angle of 4° or less from a (100) plane.

12. The semiconductor device according to claim 9, wherein:
the diode includes a mesa structure including a semiconductor layer that is epitaxially grown from the substrate,
an upper surface of the mesa structure has a rectangular or square planar shape including a side parallel to [01-1] direction and a side parallel to a [011] direction, and
the side parallel to the [011] direction is shorter than the side parallel to the [01-1] direction when the mesa structure has a rectangular shape.

13. The semiconductor device according to claim 9, wherein:
the diode includes a mesa structure including a semiconductor layer that is epitaxially grown from the substrate,
an upper surface of the mesa structure has a polygonal planar shape including a side parallel to [001] direction and a side parallel to a [010] direction.

14. The semiconductor device according to claim 1, wherein:
the circuit element is a passive element.

15. The semiconductor device according to claim 14, wherein:
the passive element is a capacitor or a resistive element.

16. The semiconductor device according to claim 14, wherein:
the first metal film includes gold and the second metal film includes copper.

17. The semiconductor device according to claim 1, wherein:
the circuit element is an active element.

18. The semiconductor device according to claim 17, wherein:
the active element is a heterojunction bipolar transistor or a field-effect transistor.

19. The semiconductor device according to claim 18, wherein:
the first metal film includes gold and the second metal film includes copper.

* * * * *